(12) United States Patent
Liu et al.

(10) Patent No.: US 11,164,910 B2
(45) Date of Patent: Nov. 2, 2021

(54) PIXEL STRUCTURES WITH AT LEAST TWO SUB-PIXELS HAVING A SAME COLOR

(71) Applicant: KUNSHAN GO-VISIONOX OPTO-ELECTRONICS CO., LTD., Kunshan (CN)

(72) Inventors: Mingxing Liu, Kunshan (CN); Weixuan Hou, Kunshan (CN); Junfeng Li, Kunshan (CN); Feng Gao, Kunshan (CN); Dongyun Lv, Kunshan (CN); Xuliang Wang, Kunshan (CN)

(73) Assignee: KUNSHAN GO-VISIONOX OPTO-ELECTRONICS CO., LTD., Kunshan (CN)

( * ) Notice: Subject to any disclaimer, the term of this patent is extended or adjusted under 35 U.S.C. 154(b) by 104 days.

(21) Appl. No.: 16/598,291

(22) Filed: Oct. 10, 2019

(65) Prior Publication Data

US 2020/0043989 A1 Feb. 6, 2020

Related U.S. Application Data

(63) Continuation of application No. PCT/CN2018/096950, filed on Jul. 25, 2018.

(30) Foreign Application Priority Data

Aug. 31, 2017 (CN) .......................... 201710776283.2
Aug. 31, 2017 (CN) .......................... 201710776284.7

(51) Int. Cl.
*H01L 27/32* (2006.01)
*H01L 51/00* (2006.01)
*H04N 13/324* (2018.01)

(52) U.S. Cl.
CPC ...... *H01L 27/3218* (2013.01); *H01L 51/0011* (2013.01); *H04N 13/324* (2018.05); *H04N 2213/001* (2013.01)

(58) Field of Classification Search
CPC ................................................. H01L 27/3218
(Continued)

(56) References Cited

U.S. PATENT DOCUMENTS

2003/0160915 A1 8/2003 Liu
2008/0001525 A1 1/2008 Chao et al.
(Continued)

FOREIGN PATENT DOCUMENTS

CN 1858827 A 11/2006
CN 101051648 A 10/2007
(Continued)

OTHER PUBLICATIONS

International Search Report dated Oct. 25, 2018 in corresponding International application No. PCT/CN2018/096950; 4 pages.
(Continued)

*Primary Examiner* — Ajay Arora
(74) *Attorney, Agent, or Firm* — Maier & Maier, PLLC

(57) ABSTRACT

Provided are a pixel structure, a mask, and a display device. The pixel structure includes a plurality of pixel groups arranged in an array. Each of the pixel groups includes a first pixel sub-group and a second pixel sub-group disposed adjacent to each other in a first direction. Each of the first pixel sub-group and the second pixel sub-group includes sub-pixels of three different colors, and each of the first pixel sub-group and the second pixel sub-group includes at least two sub-pixels having a same color and arranged consecutively.

15 Claims, 16 Drawing Sheets

(58) Field of Classification Search
USPC .......................................................... 257/89
See application file for complete search history.

(56) References Cited

U.S. PATENT DOCUMENTS

| | | | |
|---|---|---|---|
| 2008/0079748 A1 | 4/2008 | Phan | |
| 2011/0279761 A1 | 11/2011 | Kong et al. | |
| 2013/0234916 A1 | 9/2013 | Jun et al. | |
| 2014/0043448 A1 | 2/2014 | Lee et al. | |
| 2015/0213768 A1* | 7/2015 | Jung | G02F 1/1333 345/694 |
| 2016/0126296 A1* | 5/2016 | Feng | H01L 27/3218 257/40 |
| 2019/0206310 A1* | 7/2019 | Tian | H01L 27/3218 |

FOREIGN PATENT DOCUMENTS

| | | | | |
|---|---|---|---|---|
| CN | 101995668 A | | 3/2011 | |
| CN | 102053406 A | | 5/2011 | |
| CN | 102244798 A1 | | 11/2011 | |
| CN | 103578392 A | | 2/2014 | |
| CN | 103904101 A | | 7/2014 | |
| CN | 104332486 A | | 2/2015 | |
| CN | 104465714 A | | 3/2015 | |
| CN | 104809956 A | | 7/2015 | |
| CN | 105044954 A | | 11/2015 | |
| CN | 105242436 A | | 1/2016 | |
| CN | 105242436 A | * | 1/2016 | ......... H01L 27/3218 |
| CN | 205038916 U | | 2/2016 | |
| CN | 105629565 A | | 6/2016 | |
| CN | 205355055 U | | 6/2016 | |
| CN | 106019749 A | | 10/2016 | |
| CN | 106298855 A | | 1/2017 | |
| CN | 106449710 A | | 2/2017 | |
| CN | 106469743 A | | 3/2017 | |
| CN | 106486514 A | | 3/2017 | |
| CN | 106653792 A | | 5/2017 | |
| CN | 106653799 A | | 5/2017 | |
| CN | 106896594 A | | 6/2017 | |
| CN | 107086239 A | | 8/2017 | |
| TW | M300351 U | | 11/2006 | |

OTHER PUBLICATIONS

Chinese Office Action dated Dec. 13, 2018, in connection with corresponding CN Application No. 201710776283.2; 10 pages including Partial English-language translation.

Chinese Office Action dated Feb. 3, 2019, in connection with corresponding CN Application No. 201710776283.2; 9 pages including Partial English-language translation.

Chinese Office Action dated Dec. 20, 2018, in connection with corresponding CN Application No. 201710776284.7; 7 pages including Partial English-language translation.

Taiwanese Office Action dated Apr. 22, 2019, in connection with corresponding TW Application No. 107127080; 5 pages including Partial English-language translation.

Office Action dated Apr. 8, 2019, in connection with corresponding Chinese Application No. 201710776283.2 including partial English-language translation; 13 pages.

* cited by examiner

PIXEL STRUCTURES WITH AT LEAST TWO SUB-PIXELS HAVING A SAME COLOR

CROSS-REFERENCE TO RELATED APPLICATION

This application is a continuation of International Application No. PCT/CN2018/096950 filed on Jul. 25, 2018, which claims priorities to Chinese patent applications No. 201710776284.7 and No. 201710776283.2 filed on Aug. 31, 2017. Both applications are incorporated herein by reference in their entireties.

FIELD

The present disclosure relates to the field of display technologies, and particularly, to a pixel structure, a mask and a display device.

BACKGROUND

The Organic Light-Emitting Diode (OLED) display technology has a self-illuminating characteristic, and has advantages of a large viewing angle of a display screen and energy saving, thus being widely applied in a product such as mobile phone, digital video camera, DVD player, Personal Digital Assistant (PDA), notebook computer, car stereo, television and so on.

At present, a pixel juxtaposition arrangement (i.e. side-by-side arrangement) of a pixel is used in a typical pixel structure of an OLED display panel. In the side-by-side method, there are Red, Green, and Blue (R, G, B) sub-pixels in the range of one Pixel. Each sub-pixel is rectangular, and has an independent organic light-emitting component. Specifically, as shown in FIG. 1A, each pixel unit includes an R (red) sub-pixel 101, a G (green) sub-pixel 103, and a B (blue) sub-pixel 105, arranged in a straight line. The R, G, B sub-pixels are all rectangular, all sub-pixels are equal in size, and the ratio of the numbers of the R, G, B sub-pixels is 1:1:1. Such pixel structure is generally called Real RGB in industry.

SUMMARY

A first object of the present disclosure is to provide a pixel structure, a mask and a display device for achieving a higher resolution.

A second object of the present disclosure is to provide a pixel structure, a mask and a display device for increasing the display uniformity.

In order to solve the foregoing technical problem, the present disclosure provides a pixel structure, comprising a plurality of pixel groups arranged in an array, wherein each of the pixel groups comprises a first pixel sub-group and a second pixel sub-group disposed adjacent to each other in a first direction, each of the first pixel sub-group and the second pixel sub-group comprises sub-pixels of three different colors, and each of the first pixel sub-group and the second pixel sub-group comprises at least two sub-pixels having a same color and arranged consecutively.

Alternatively, the sub-pixels of three different colors comprise first sub-pixel(s), second sub-pixel(s), and third sub-pixels; in each pixel sub-group, the number of first sub-pixel(s) is equal to the number of second sub-pixel(s), and the number of third sub-pixels is the sum of the number of first sub-pixel(s) and the number of second sub-pixel(s), wherein the first sub-pixel(s) and the second sub-pixel(s) are arranged in a second direction to form a pixel group row, the third sub-pixels are consecutively arranged in the second direction and form another pixel group row disposed adjacent to the pixel group row in the first direction, wherein the another pixel group row in the first pixel sub-group and the another pixel group row in the second pixel sub-group are separated by the pixel group row in the first pixel sub-group or the second pixel sub-group, and two adjacent pixel groups in the second direction are misaligned with each other.

Optionally, in the first pixel sub-group and the second pixel sub-group of each pixel group, an order of the first sub-pixel(s) is the same as an order of the second sub-pixel(s); or in the first pixel sub-group and the second pixel sub-group of each pixel group, an order of the first sub-pixel(s) is different from an order of the second sub-pixel(s).

Optionally, in each pixel sub-group, the number of the first sub-pixel(s) and the second sub-pixels is one or more; and when a plurality of the first sub-pixels and the second sub-pixels are comprised in each pixel sub-group, the first sub-pixels and the second sub-pixels are alternately arranged in the second direction, or two or more of the first sub-pixels are arranged to form a first sub-pixel group, and the second sub-pixels equaling to the sub-pixels in the first sub-pixel group in number are arranged to form a second sub-pixel group, and the first sub-pixel group and the second sub-pixel group are consecutively arranged in the second direction.

Optionally, in two pixel groups adjacent to each other in the second direction and misaligned with each other, a region defined by each of the another pixel group rows in one of the two pixel groups at least partially coincides with a region defined by a corresponding pixel group row in the other one of the two pixel groups.

Optionally, each of the pixel groups is divided into at least one pixel unit, each pixel unit comprising sub-pixels of three colors; and during division of the pixel unit, no sub-pixel in each of the pixel groups is shared, or at least one sub-pixel in each of the pixel groups is shared.

Optionally, one first sub-pixel and one second sub-pixel adjacent to each other in the second direction are shared by two third sub-pixels adjacent to the first sub-pixel and/or the second sub-pixel in the first direction to form two pixel units, or one first sub-pixel and one second sub-pixel arranged diagonally are shared by two diagonally arranged third sub-pixels to form two pixel units, and each of the pixel units comprises one first sub-pixel, one second sub-pixel, and one third sub-pixel.

Optionally, in all pixel units divided from all pixel groups, some of the pixel units are used for realizing left eye display, and some of the pixel units are used for realizing right eye display.

Optionally, the first pixel sub-group and the second pixel sub-group in each of the pixel groups are misaligned with each other, each of the first pixel sub-group and the second pixel sub-group comprises sub-pixel groups of three different colors, an order of the sub-pixel groups of three different colors in the first pixel sub-group is different from an order of the sub-pixel groups of three different colors in the second pixel sub-group, and each sub-pixel group comprises at least two sub-pixels having a same color and consecutively arranged in the first direction.

Optionally, the first pixel sub-group and the second pixel sub-group in each of the pixel groups are disposed adjacent to each other in the first direction, the sub-pixel groups of three different colors in each of the first pixel sub-group and the second pixel sub-group are consecutively arranged in the second direction, and the arrangement position of the sub-pixel group of at least one color in the first pixel sub-group is different from the arrangement position of the sub-pixel group of at least one color in the second sub-group.

Optionally, the sub-pixel groups of three different colors comprise a first sub-pixel group, a second sub-pixel group, and a third sub-pixel group; in a same pixel group, the center line of the third sub-pixel group of the second pixel sub-group in the second direction is located in a gap between the first sub-pixel group and the second sub-pixel group in the first pixel sub-group, or the center line of the first sub-pixel group of the first pixel sub-group in the second direction is located in a gap between the second sub-pixel group and the third sub-pixel group in the second pixel sub-group.

Optionally, each of the pixel groups is divided into at least one pixel unit, each pixel unit comprises sub-pixels of three colors; and during division of the pixel unit, no sub-pixel in each of the pixel groups is shared, or at least one sub-pixel in each of the pixel groups is shared.

Optionally, during division of the pixel unit, each sub-pixel in the first sub-pixel sub-group and the second sub-pixel sub-group in each of the pixel groups is shared.

Optionally, in all pixel units divided from all pixel groups, some of the pixel units are used for realizing left eye display, and some of the pixel units are used for realizing right eye display.

The present disclosure also discloses a mask for manufacturing one of the above pixel structures, comprising a plurality of evaporation openings.

Optionally, a size of each of the plurality of evaporation opening of the mask corresponds to a sum of the sizes of at least two sub-pixels of a same color in the pixel structure.

The present disclosure also provides a display device, comprising the above pixel structure.

The technical solution of the present disclosure has the following advantageous effects:

1. each pixel group includes a first pixel sub-group and a second pixel sub-group disposed adjacent to each other in a first direction, and each of the first pixel sub-group and the second pixel sub-group includes sub-pixels of three different colors, i.e., first sub-pixel(s), second sub-pixel(s), and third sub-pixels. The number of first sub-pixel(s) is equal to the number of second sub-pixel(s), and the number of third sub-pixels is the sum of the number of first sub-pixel(s) and the number of second sub-pixel(s), the first sub-pixel(s) and the second sub-pixel(s) is arranged in a second direction to form a pixel group row, the third sub-pixels being arranged in the second direction to form another pixel group row. The another pixel group row in the first pixel sub-group and the another pixel group row in the second pixel sub-group are separated by the pixel group row in the first pixel sub-group or the second pixel sub-group. Two adjacent pixel groups in the second direction are misaligned with each other, so that the sub-pixel distributions in the first direction and the second direction are relatively consistent, thereby enabling to greatly increase the display uniformity;

2. corresponding pixel units may be divided according to different display requirements, and each of the divided pixel units includes sub-pixels of three different colors, i.e., the first to third sub-pixels. That is, each pixel pitch includes three colors. When the three colors are red, green, and blue, combinations of different gray scale and color are able to be achieved by adjusting the display ratio of red, green and blue, so that panchromatic display in true sense is able to be achieved, and thus a wide range of application is able to be obtained;

3. at least two sub-pixels of a same color is able to share one evaporation opening, reducing space occupation and the difficulties of the preparation process and the evaporation process of the evaporation mask, increasing the strength of the mask, facilitating the preparation of small-pitch sub-pixels, and improving the PPI of the display device; and 4. some of the pixel units are able to be used for achieving left eye display and some of the pixel units are able to be used for achieving right eye display through time-sharing control, so that the display device including the pixel structure is also able to be used for VR and 3D display.

DETAILED DESCRIPTION OF THE INVENTION

Figure 1A:
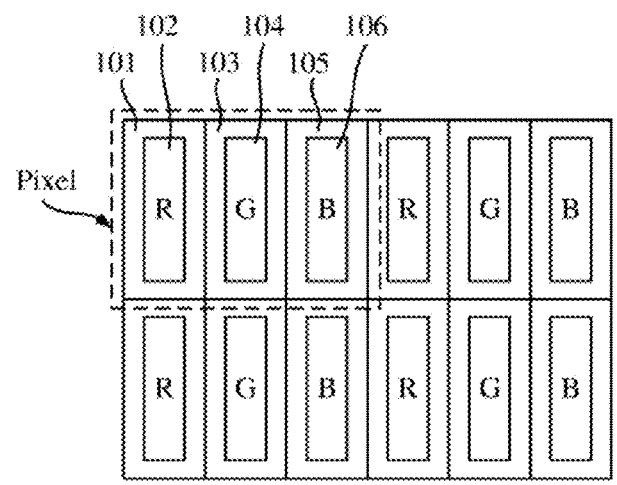
FIG. 1A is an arrangement schematic diagram of a pixel structure of an OLED display panel.
Figure 1B:
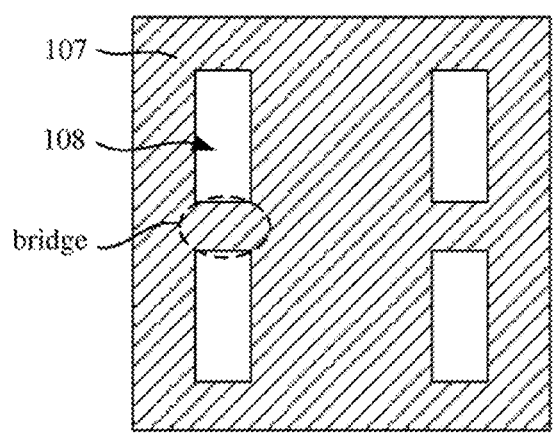
FIG. 1B is a schematic diagram of an FMM corresponding to FIG. 1A.

The pixel structure shown in FIG. 1A is generally achieved by evaporation using a Fine Metal Mask (FMM) as shown in FIG. 1B. The FMM includes a shielding region 107 and a plurality of evaporation openings 108. The shielding region between adjacent two evaporation openings 108 in a same column is called a bridge. The FMM generally has a limitation of a minimum opening. The sub-pixels of different colors in the evaporation process have a spacing limitation between the openings. The preparation of the OLED pixel structure is inevitably limited by the FMM opening and the precision of the evaporation process. In the pixel structure shown in FIG. 1A, when the Pixel Per Inch (PPI) is higher than 300 PPI, the present FMM process is difficult to achieve, thus failing to meet the development requirements of a high PPI of an OLED display device.

In addition, the inventors have found that the pixel structure shown in FIG. 1A has a different arrangement of pixels in the row and column direction, thereby failing to achieve a display effect of high uniformity.

Applicants have found through research that the traditional RGB pixel structure not only cannot meet the product requirement of a high PPI display effect, but also cannot meet the product requirement of a uniform display effect, and moreover, it is also difficult to use for Virtual Reality (VR) and 3D display.

On this basis, the present disclosure provides a pixel structure, comprising a plurality of pixel groups arranged in an array, wherein each of the pixel groups comprises a first pixel sub-group and a second pixel sub-group disposed adjacent to each other in a first direction, each of the first pixel sub-group and the second pixel sub-group each comprises sub-pixels of three different colors, i.e., first sub-pixel(s), second sub-pixel(s), and third sub-pixels, and each pixel sub-group comprises at least two sub-pixels having a same color and arranged consecutively, thereby enabling to share a same evaporation opening, reducing space occupation, increasing the strength of the mask, facilitating the preparation of small-pitch sub-pixels, and improving the PPI and resolution of the display device including the pixel structure.

The pixel structure, the mask, and the display device provided by the present disclosure will be further described in detail below with reference to the accompanying drawings. The drawings are presented in a very simplified form and not necessarily presented to scale, with the only purpose of facilitating convenience and clarity in explaining the embodiments of the present disclosure, and only a part of the corresponding structures is shown in each drawing. An actual product can be correspondingly changed according to actual display needs. In addition, a first row, a second row, a first column, a second column described in the present disclosure are all reference standards as illustrated in the drawings for describing the present disclosure, rather than indicating the rows and columns in the actual product. For example, the "column direction" in the present disclosure may be the Y direction, or may be the X direction perpendicular to the Y direction, and the "row direction" may be the X direction or the Y direction.

According to a first group of embodiments of the present disclosure, in each of the pixel groups, the first pixel sub-group and the second pixel sub-group are disposed adjacent to each other in the first direction and misaligned with each other, wherein at least two sub-pixels of a same color are consecutively arranged in the first direction to form a sub-pixel group, each of the first pixel sub-group and the second pixel sub-group comprises sub-pixel groups of three different colors, and the order of the sub-pixel groups of three different colors in the first pixel sub-group is different from the order of the sub-pixel groups of three different colors in the second pixel sub-group. The first pixel sub-group and the second pixel sub-group of the pixel group in such a pixel structure are adjacent to and misaligned with each other, and two sub-pixels of a same color in each pixel sub-group can share a same evaporation opening, thereby reducing the space occupation, increasing the strength of the mask, facilitating the preparation of small-pitch sub-pixels, and improving the PPI and resolution of the display device including the pixel structure.

Figure 2A:
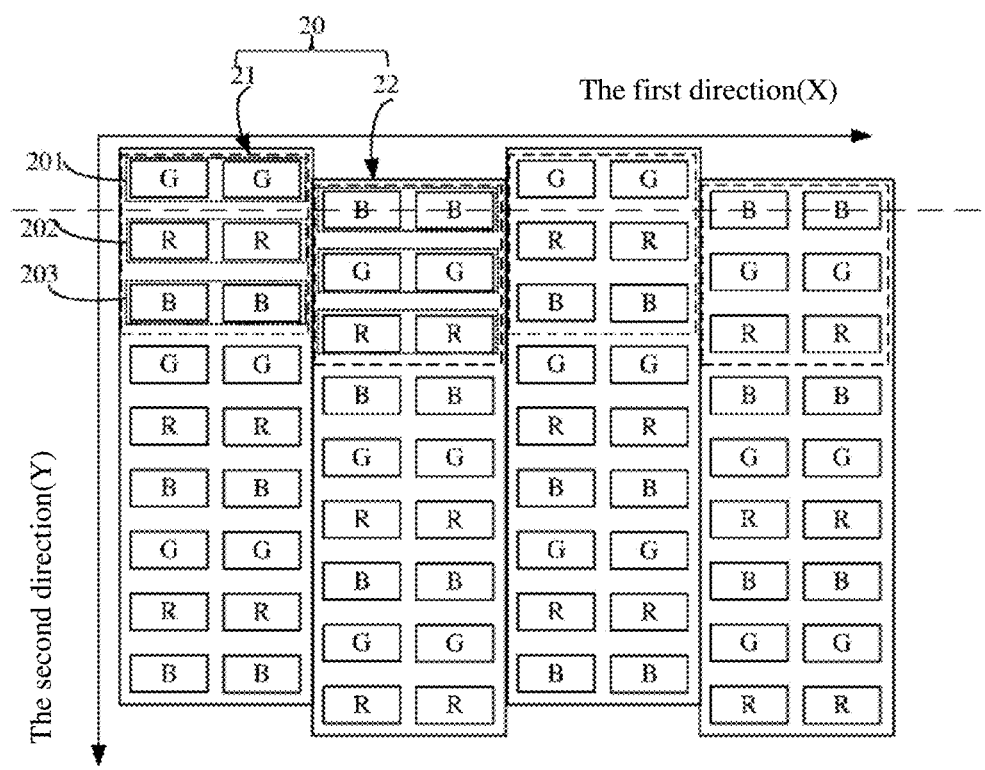
FIG. 2A to FIG. 2D are schematic diagrams showing the arrangement of pixel structures according to a first group of embodiments of the present disclosure.

Referring to FIG. 2A, an embodiment of the present disclosure provides a pixel structure, comprising a plurality of pixel groups 20 arranged in an array, wherein each of the pixel groups 20 comprises a first pixel sub-group 21 and a second pixel sub-group 22 disposed adjacent to each other in a first direction (X direction) and misaligned with each other, and each of the first pixel sub-group 21 and the second pixel sub-group 22 includes sub-pixel groups of three different colors, i.e., red (R), green (G), and blue (B), wherein the first pixel sub-group 21 includes a first sub-pixel group 201, a second sub-pixel group 202, and a third sub-pixel group 203 consecutively arranged in a second direction (Y direction); the second pixel sub-group 22 includes a third sub-pixel group 203, a first sub-pixel group 201, and a second sub-pixel group 202 consecutively arranged in the second direction (Y direction); and each sub-pixel group includes at least two sub-pixels having a same color and arranged adjacent to each other in the first direction. The pixel structure of this embodiment is substantially formed by two types of pixel group columns alternately and repeatedly arranged in the X direction, and two adjacent pixel group columns are misaligned with each other, one type of the pixel group columns is formed by a plurality of first pixel sub-groups 21 consecutively and repeatedly arranged in the second direction, and the other type of the pixel group columns is formed by a plurality of second pixel sub-groups 22 consecutively and repeatedly arranged in the second direction. In other words, the sub-pixels in all the odd-numbered pixel group columns are arranged in a same manner, and the sub-pixels in the even-numbered pixel group columns are also arranged in a same manner. However, the sub-pixel groups of a same color in the odd-numbered pixel group columns and the even-numbered pixel group columns are not horizontally aligned, but are staggered (shifted) from each other. In two adjacent pixel group columns, the height of the pixel group column (an odd-numbered column) formed by the first pixel sub-group 21 is higher in the second direction than that of the pixel group column (an even-numbered column) formed by the second pixel sub-group 22, and the pixel group column (an even-numbered column) formed by the second pixel sub-group 22 is misaligned downward relative to the pixel group column (an odd-numbered column) formed by the first pixel sub-group 21. Moreover, a gap between the first sub-pixel group 201 (such as GG in the first row of 21 in FIG. 2A) and the second sub-pixel group 202 (such as RR in the second row of 21 in FIG. 2A) of the first pixel sub-group 21 in each pixel unit coincides with a center line of the third sub-pixel group 203 (such as BB in the first row of 22 in FIG. 2A) of the second pixel sub-group 22 in the second direction, as indicated by the dotted line 1 in FIG. 2A. It should be noted that, in other embodiments of the present disclosure, the coincidence of center line shown in FIG. 2A can be adaptively changed to be non-coincidence when the shape of each sub-pixel in each sub-pixel group of the pixel structure and/or the order of each sub-pixel group in each sub-pixel group of the pixel structure is changed.

The following is a detailed description of the technical solution of this embodiment in which the color of the first sub-pixel group 201 is green, the color of the second sub-pixel group 202 is red, and the color of the third sub-pixel group 203 is blue.

Still referring to FIG. 2A, the two sub-pixels of the first sub-pixel group 201 are green sub-pixels disposed adjacent to each other in the first direction, labeled as G, and the two sub-pixels G have a same shape and size so as to share an evaporation opening of the mask. The two sub-pixels of the second sub-pixel group 202 are red sub-pixels disposed adjacent to each other in the first direction, labeled as R, and the two R sub-pixels have a same shape and size so as to share an evaporation opening of the mask. The two sub-pixels of the third sub-pixel group 203 are blue sub-pixels disposed adjacent to each other in the first direction, labeled as B, and the two B sub-pixels have a same shape and size so as to share an evaporation opening of the mask. Six sub-pixels in the first pixel sub-group 21 are arranged in an array of three rows and two columns (GG/RR/BB), and the elements on the two columns of the array are the same with the two elements on the same row of the array being the same. The sub-pixel groups of three colors in the second pixel sub-group 22 is arranged in a completely different order from the sub-pixel groups of three colors in the first pixel sub-group 21, which is arranged as the third sub-pixel group 203 (B), the first sub-pixel group 201 (G), and the second sub-pixel group 202(R) in the second direction, and also forms an array of three rows and two columns (BB/GG/RR). The second pixel sub-group 22 is misaligned downward relative to the first pixel sub-group 21, and the center line of the first row (BB) of sub-pixels of the second pixel sub-group 22 in the second direction coincides with a gap between the first row (GG) and the second row (RR) of the first pixel sub-group 21, as shown by the dotted line 1 of FIG. 2A parallel to the first direction and passing through BB.

The shapes and sizes of the sub-pixels of various colors can be adaptively adjusted according to the service life of each sub-pixel. Preferably, in the same pixel group, all of the sub-pixels have the same shape and size; or, the sub-pixels of two colors have the same shape and size, so that the sub-pixels of at least two colors can be made by using the same mask. For example, in the same pixel group, the shape and size of the sub-pixel R and the sub-pixel B are the same, and the shape of the sub-pixel G is the same as that of the sub-pixel R with the size of the sub-pixel G being larger or smaller than the size of the sub-pixel R, so that the same mask is subjected to two evaporation process to form the sub-pixel R and the sub-pixel B, thereby reducing the process cost. In addition, the shapes of the sub-pixels of various colors may be strips, and the strip may be a right-angled rectangle, a rounded rectangle, and a notched rectangle. A length-width ratio of the rectangle corresponding to the strip may be 1:1, 2:1. 3:1, 3:2, or 4:3, to optimize or increase the wiring space as much as possible in the case of a certain pixel pitch or PPI.

In addition, in an actual manufacturing, a certain deviation is allowed between the actual shapes (and sizes) of various products and the designed shapes (and sizes) of various products. In general, as long as the actual shape (and size) of the product is within the allowable deviation range of the designed shape (and size) of the product, the requirements of use can be met. For example, the shapes of the sub-pixel G, the sub-pixel R, and the sub-pixel B may also be rectangle-like shapes, such as an approximately rectangular or approximately square trapezoid. The trapezoid may be an isosceles trapezoid or a non-isosceles trapezoid, and may be a regular trapezoid, an inverted trapezoid, a trapezoid rotating 90 degrees to the left or a trapezoid rotating 90 degrees to the right. In a preferred embodiment, the trapezoid is an isosceles trapezoid, the difference in size between the upper base and the lower base of the isosceles trapezoid being less than 10% of the length of the lower base, an included angle of the waist and the upper side of the isosceles trapezoid being greater than 90 degrees and less than 100 degrees, an included angle of the waist and the lower base of the isosceles trapezoid being greater than 80 degrees and less than 90 degrees. In this way, the shapes of the sub-pixel G, the sub-pixel R and the sub-pixel B are approximately square (within the allowable deviation range), and thus a better arrangement effect can stilled be obtained.

Figure 2B:
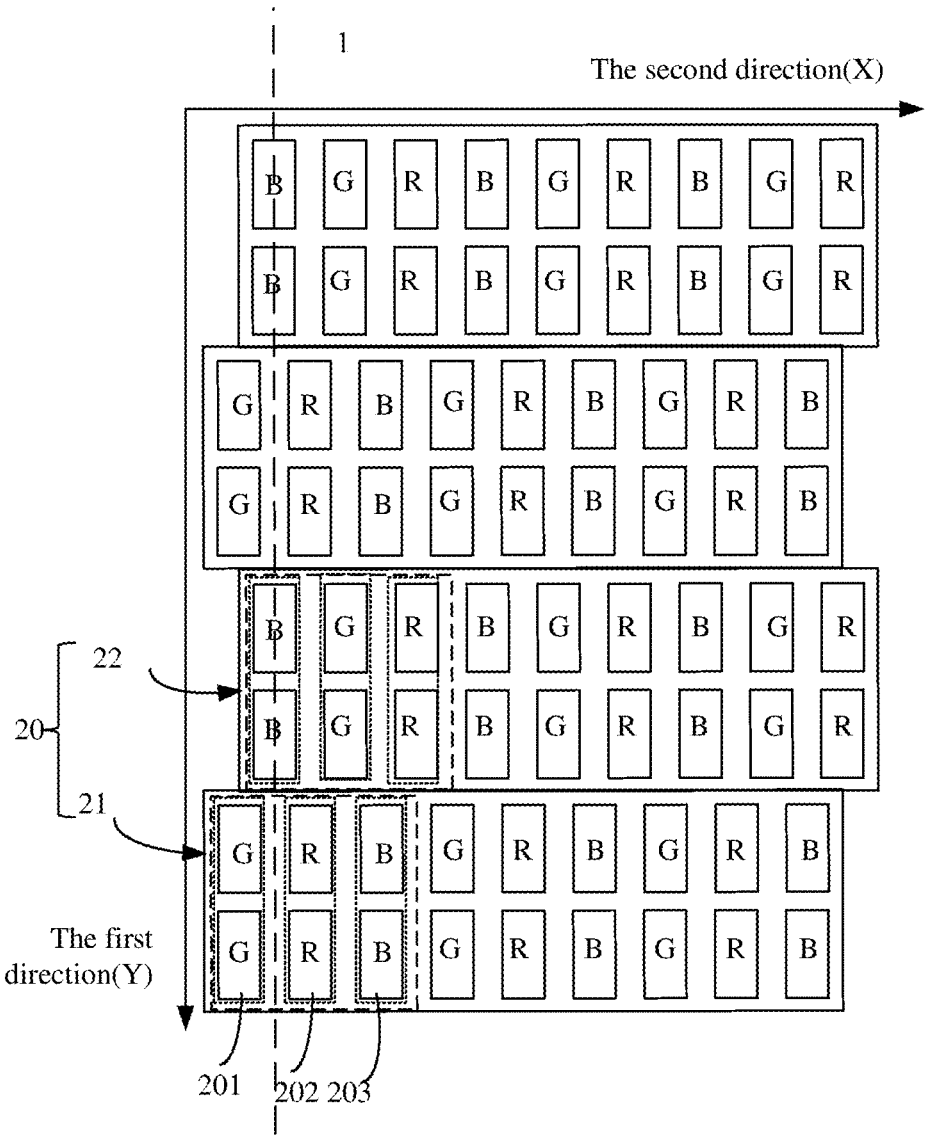

In addition, according to the actual design and production needs, the pixel structure shown in FIG. 2A may be rotated by 90 degrees to the left or right, and certainly, may also be rotated by 180 degrees. For example, a pixel structure as shown in FIG. 2B can be obtained by rotating FIG. 2A by 90 degrees to the left. As shown in FIG. 2B, the pixel structure comprises a plurality of pixel groups 20 arranged in an array. Each pixel group 20 comprises a first pixel sub-group 21 and a second pixel sub-group 22 disposed adjacent to each other in the first direction (Y direction) and each comprising sub-pixel groups of three different colors of RGB, wherein the first pixel sub-group 21 comprises a first sub-pixel group 201, a second sub-pixel group 202, and a third sub-pixel group 203 consecutively arranged in the second direction (X direction); and the second pixel sub-group 22 comprises a third sub-pixel group 203, a first sub-pixel group 201, and a second sub-pixel group 202 consecutively arranged in the second direction. Each sub-pixel group comprises two sub-pixels having a same color and arranged adjacent to each other in the first direction. That is, six sub-pixels of the first pixel sub-group 21 are arranged in an array of two rows and three columns (GRB/GRB), and the elements on two rows of the array are the same with the two elements on the same column of the array being the same. The sub-pixel groups of three colors in the second pixel sub-group 22 have different positions from sub-pixel groups of three colors in the first pixel sub-group 21, which is also arranged in an array of two rows and three columns (BGR/BGR). In each pixel group 20, the second pixel sub-group 22 is misaligned rightward relative to the first pixel sub-group 21, and the center line of the first column (BB) of sub-pixels of the second pixel sub-group 22 in the second direction coincides with a gap between the first column (GG) and the second column (RR) of the first pixel sub-group 21, as shown by the dotted line 1 of FIG. 2B parallel to the first direction and passing through BB. Such a pixel structure is substantially formed by two types of pixel group rows alternately and repeatedly arranged in the Y direction, and two adjacent pixel group rows are misaligned with each other, wherein one type of pixel group rows is formed by a plurality of first pixel sub-groups 21 consecutively arranged in the second direction, and the other type of pixel group rows is formed by a plurality of second pixel sub-groups 22 consecutively arranged in the second direction. In other words, the sub-pixels in all the odd-numbered pixel group rows are arranged in a same manner, and the sub-pixels in all the even-numbered pixel group rows are also arranged in a same manner. However, the sub-pixel groups of a same color in the odd-numbered pixel group rows and the even-numbered pixel group rows are not vertically aligned, but are staggered (shifted) from each other.

Figure 2C:
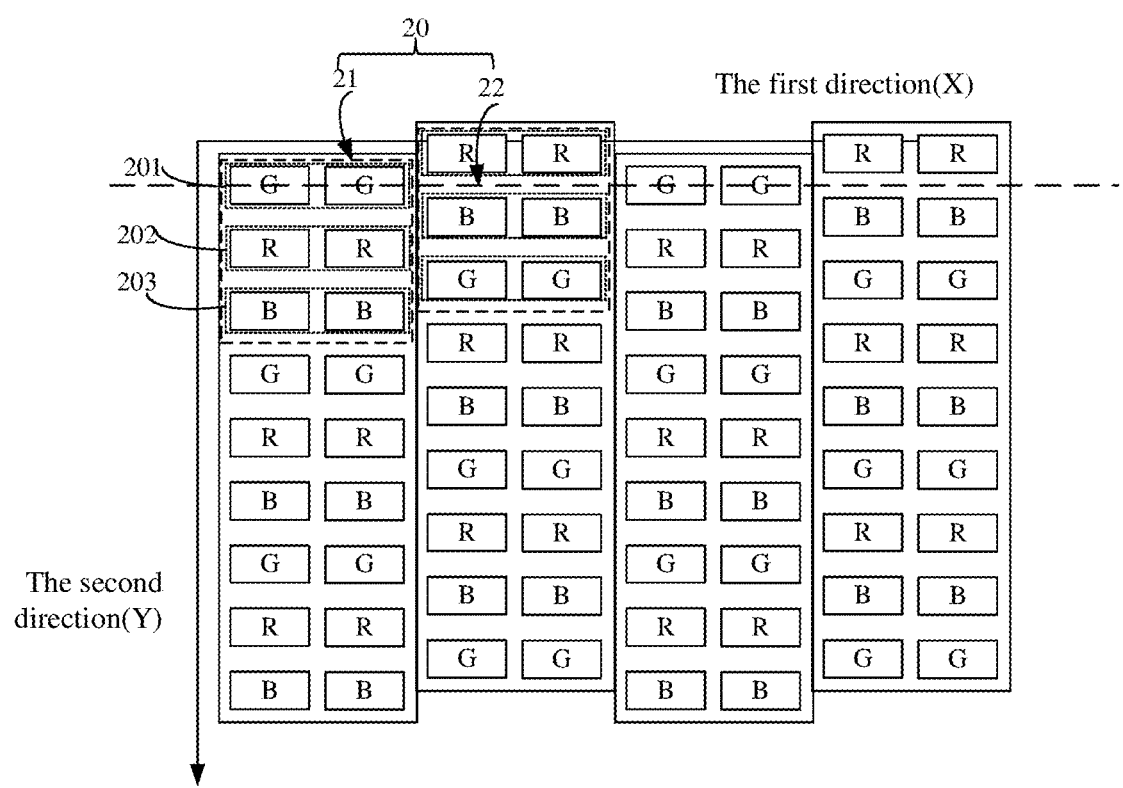

Referring to FIG. 2C, an embodiment of the present disclosure also provides a pixel structure, comprising a plurality of pixel groups 20 arranged in an array, and each of the pixel groups 20 comprises a first pixel sub-group 21 and a second pixel sub-group 22 disposed adjacent to each other in the first direction (X direction) and each comprising sub-pixel groups of three different colors of red (R), green (G), and blue (B). Compared with the embodiment shown in FIG. 2A, the first pixel sub-group 21 and the second pixel sub-group 22 of this embodiment have opposite misalignment directions. Specifically, the first pixel sub-group 21 includes a first sub-pixel group 201, a second sub-pixel group 202, and a third sub-pixel group 203 arranged in the second direction (Y direction), and the second pixel sub-group 22 includes a second sub-pixel group 202, a third sub-pixel group 203, and a first sub-pixel group 201 consecutively arranged in the second direction, wherein each sub-pixel group includes two sub-pixels having a same color and arranged adjacent to each other in the first direction. For example, the first sub-pixel group 21 is an array of three rows and two columns of GG/RR/BB, and the second sub-pixel group 22 is an array of three rows and two columns of RR/BB/GG when the first sub-pixel group 201 includes two green sub-pixels GG arranged in the same row, the second sub-pixel group 202 includes two red sub-pixels RR arranged in the same row, and the third sub-pixel group 203 includes two blue sub-pixels BB arranged in the same row. In the same pixel group 20, the height of the first pixel sub-group 21 in the second direction is lower than the height of the second pixel sub-group 22 in the second direction, so that the second pixel sub-group 22 is misaligned upward relative to the first pixel sub-group 21, and the center line of the first sub-pixel group 201 of the first pixel sub-group 21 in the second direction coincides with the gap between the second sub-pixel group 202 and the third sub-pixel group 203 of the second pixel sub-group 22 in the second direction. That is, the GG row of the first sub-pixel group 21 is misaligned downward relative to the RR row of the adjacent second sub-pixel group 22, and the center line of the GG row of the first sub-pixel group 21 coincides with the gap between the RR row and the BB row of the second sub-pixel group 22, labeled as 1'. The pixel structure of this embodiment is substantially formed by two types of pixel group columns arranged consecutively and repeatedly, and two adjacent pixel group columns are misaligned with each other; wherein one type of pixel group columns is formed by a plurality of first pixel sub-groups 21 consecutively arranged in the second direction, and the other type of pixel group columns is formed by a plurality of second pixel sub-groups 22 consecutively arranged in the second direction. In other words, the sub-pixels in all the odd-numbered pixel group columns are arranged in the same manner, and the sub-pixels in the even-numbered pixel group columns are arranged in the same manner. However, the sub-pixel groups of the same color in the odd-numbered pixel group columns and the even-numbered pixel group columns are not horizontally aligned, but are staggered (shifted) from each other.

Figure 2D:
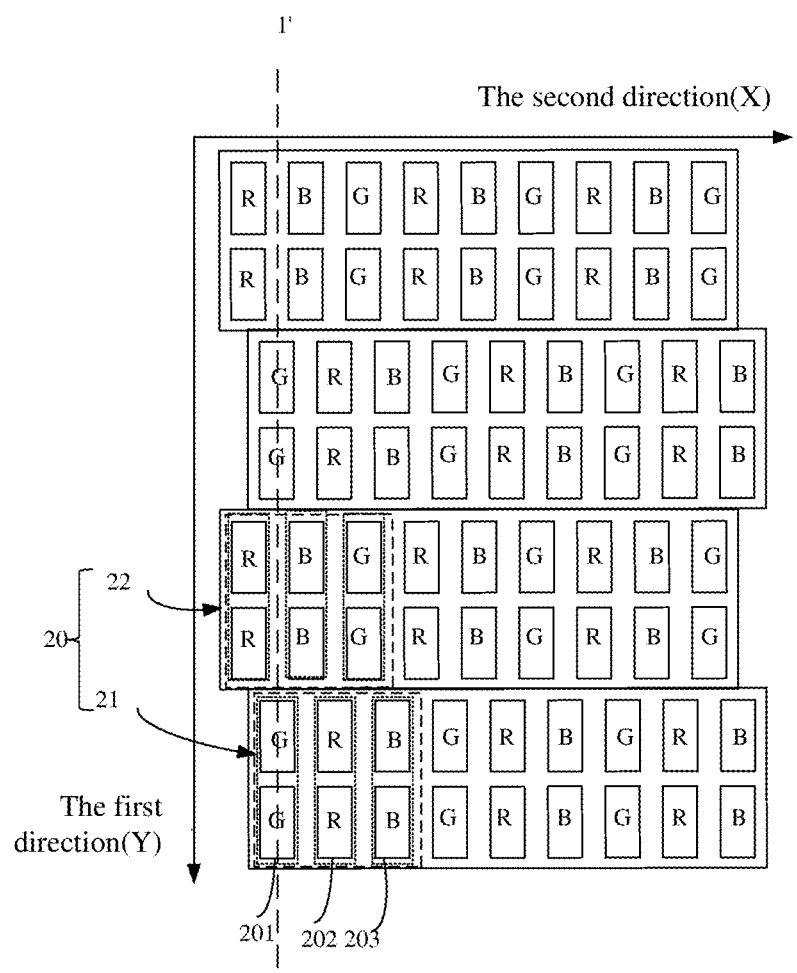

In addition, according to the actual design and production needs, the pixel structure as shown in FIG. 2C is rotated by 90 degrees to the left or right, and may also be rotated by 180 degrees. For example, a pixel structure as shown in FIG. 2D can be obtained by rotating FIG. 2C 90 degrees to the left. As shown in FIG. 2D, the pixel structure comprises a plurality of pixel groups 20 arranged in an array. Each pixel group 20 comprises a first pixel sub-group 21 and a second pixel sub-group 22 disposed adjacent to each other in the first direction (Y direction) and each pixel sub-group comprising sub-pixel groups of three different colors of RGB, wherein the first pixel sub-group 21 comprises a first sub-pixel group 201, a second sub-pixel group 202, and a third sub-pixel group 203 consecutively arranged in the second direction (X direction); and the second pixel sub-group 22 comprises a second sub-pixel group 202, a third sub-pixel group 203, and a first sub-pixel group 201 consecutively arranged in the second direction. Each sub-pixel group comprises two sub-pixels having a same color and arranged adjacent to each other in the first direction. That is, six sub-pixels of the first pixel sub-group 21 are arranged in an array of two rows and three columns (GRB/GRB), and the elements on two rows of the array are the same with the two elements on the same column of the array are the same. The sub-pixel groups of three colors in the second pixel sub-group 22 have different positions from sub-pixel groups of three colors in the first pixel sub-group 21, which is also arranged in an array of two rows and three columns (RBG/RBG). In each pixel group 20, the second pixel sub-group 22 is misaligned leftward relative to the first pixel sub-group 21, and the center line of the first column (GG) of sub-pixels of the first pixel sub-group 21 in the first direction coincides with the center line between the first column (RR) and the second column (BB) of the second pixel sub-group 22, as shown by the dotted line 1' of FIG. 2D parallel to the second direction and passing through GG. Such a pixel structure is substantially formed by two types of pixel group rows alternately and repeatedly arranged in the first direction, and two adjacent pixel group rows are misaligned with each other, wherein one type of pixel group rows is formed by a plurality of first pixel sub-groups 21 consecutively arranged in the second direction, and the other type of pixel group rows is formed by a plurality of second pixel sub-groups 22 consecutively arranged in the second direction. In other words, the sub-pixels in all the odd-numbered pixel group rows are arranged in a same manner, and the sub-pixels in all the even-numbered pixel group rows are also arranged in a same manner. However, the sub-pixel groups of a same color in the odd-numbered pixel group rows and the even-numbered pixel group rows are not vertically aligned, but are staggered (shifted) from each other.

In each pixel group of the present disclosure, the order of sub-pixel groups of three different colors in the first pixel sub-group and the second pixel sub-group is not limited to the forms listed in the foregoing embodiments, As long as the arrangement positions (or called syn-positions) of the sub-pixel groups of at least one color in the first pixel sub-group are different from the arrangement positions (or called syn-positions) of the sub-pixel groups of at least one color in the second pixel sub-group, the requirement that the order of sub-pixel groups of three different colors in the first pixel sub-group is different from the order of sub-pixel groups of three different colors in the second pixel sub-group is able to be met. For example, when the sub-pixel groups of three different colors in the first pixel sub-group are consecutively arranged in the second direction as a first sub-pixel group, a second sub-pixel group, and a third sub-pixel group, the sub-pixel groups of three different colors in the second pixel sub-group can also be consecutively arranged in the second direction as a third sub-pixel group, a first sub-pixel group and a second sub-pixel group, or a second sub-pixel group, a third sub-pixel group and a first sub-pixel group, or a third sub-pixel group, a second sub-pixel group and a first sub-pixel group, or a second sub-pixel group, a first sub-pixel group and a third sub-pixel group. Preferably, the order of the sub-pixel groups of three different colors in the first pixel sub-group and the second pixel sub-group is advantageous to divide more pixel units to improve the display effect.

Each of the sub-pixel groups in the first group of embodiments has two sub-pixels having a same color and arranged adjacent to each other. However, the pixel structure of the present disclosure is not limited thereto, and each sub-pixel group may also contain three or more sub-pixels having a same color, each sub-pixel disposed adjacent to another sub-pixel, which can achieve the technical objects of the present disclosure and are also within the protection scope of the present disclosure.

In the pixel structure of the first group of embodiments of the present disclosure, each sub-pixel (R/G/B) includes a light-emitting region (a display region) and a non-light-emitting region (a non-display region). The light-emitting region of each sub-pixel includes a cathode, an anode, and an electroluminescent layer (also called an organic light-emitting layer), and the electroluminescent layer is located between the cathode and the anode and configured to generate light of a predetermined color to achieve display. Generally, in the pixel structure of the present disclosure, the evaporation process is performed three times to form electroluminescent layers of corresponding colors (e.g., red, green, or blue) in the light-emitting regions of the corresponding sub-pixels, respectively.

Figure 3:
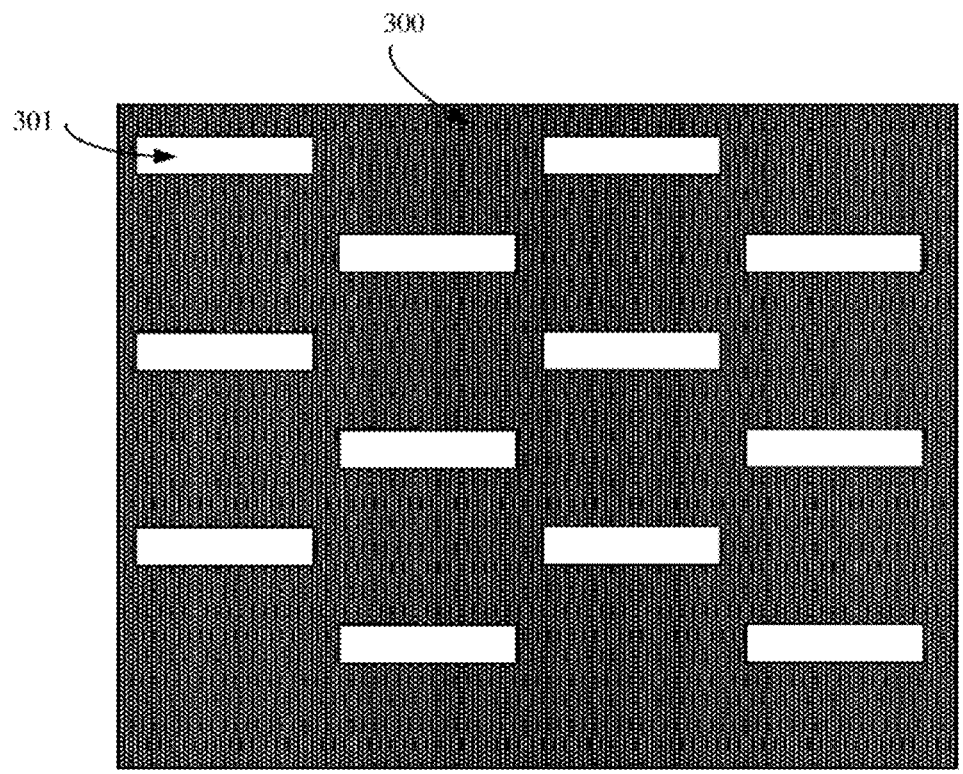
FIG. 3 is a schematic diagram of an FMM according to the first group of embodiments of the present disclosure.

FIG. 3 is a schematic diagram of an FMM for evaporation of a sub-pixel of a certain color, corresponding to the pixel structure shown in FIG. 2A. As shown in FIG. 3, the mask has a plurality of evaporation openings 301, and each of the evaporation openings 301 corresponds to a sub-pixel group in the first sub-pixel group 21 or the second sub-pixel group 22 of a corresponding position in FIG. 2A (i.e., two sub-pixels of a same color in a same row). Since the sub-pixel groups of the same color in the odd-numbered pixel group columns and the even-numbered pixel group columns are not horizontally aligned, but are staggered (shifted) from each other, the evaporation openings 301 on the evaporation mask (e.g., the FMM) for forming sub-pixel groups of a same color are also staggered. Thus, the strength of the FMM is able to be increased, the problems such as warping and fracture of the FMM are able to be avoided as much as possible, and the defects affecting the evaporation quality such as dizzy and offset of the evaporation film are able to be reduced. The sub-pixel groups of three colors are arranged in a same manner when all sub-pixels have the same shapes and sizes, resulting in the sub-pixels of three colors being able to be evaporated by a shared mask in an offset manner to save cost. Two sub-pixels in a same row of each sub-pixel group may share an evaporation opening 301, thereby reducing space occupation. The aperture ratio may be increased to improve the PPI, or the existing openings are made larger without increasing the opening to facilitate reduction of the process difficulty.

The pixel structure of the first group of embodiments of the present disclosure is arranged in an array in units of "pixel group 20", and the adjacent first pixel sub-group 21 and the second pixel sub-group 22 in the pixel structure are misaligned with each other, the structure thereof thus greatly changes relative to the conventional pixel structure as shown in FIG. 1A. Therefore, the division of the pixel units (or a driving method for display) also changes, and each of the divided pixel units includes sub-pixels of three colors, to achieve panchromatic display. The pixel structure of the present disclosure is able to be used for 2D flat panel display, and is further able to be used for 3D (stereoscopic or three-dimensional) display by means of time-sharing control. Specific division manners of the pixel unit for the pixel structure of the present disclosure will be described in detail below taking the pixel structure shown in FIG. 2A as an example.

Figure 4A:
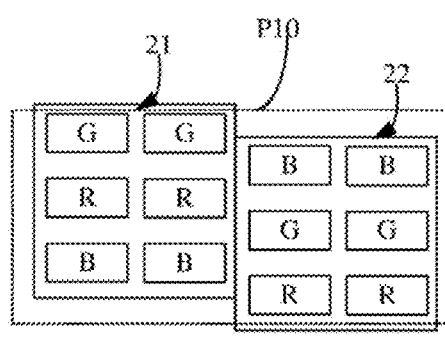
FIG. 4A to FIG. 4H are schematic diagrams showing division of pixel units according to the first group of embodiments of the present disclosure.

Referring to FIG. 4A, in an embodiment of the present disclosure, each pixel group 20 may be defined as one pixel unit P10, i.e., each pixel unit P10 includes one first pixel sub-group 21 and one second pixel sub-group 22. That is, each pixel unit P10 includes four R sub-pixels, four B sub-pixels, and four G sub-pixels. Each pixel unit in such division manner of the pixel units includes sub-pixels of three colors of R, G and B, enabling the achievement of a panchromatic display, being able to be used in the 2D display mode and having a better display effect due to a larger number of the sub-pixels.

Figure 4B:
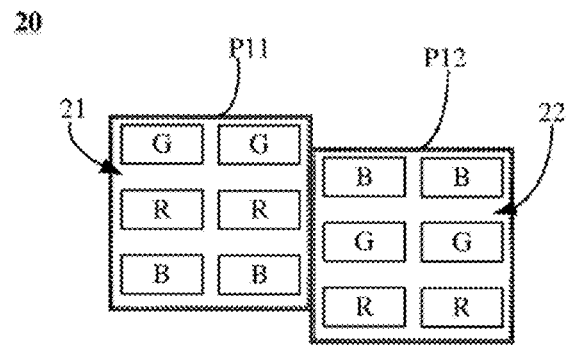

Referring to FIG. 4B, in an embodiment of the present disclosure, each pixel group 20 may be divided into two pixel units, the first pixel sub-group 21 is a pixel unit P11, and the second pixel sub-group 22 is a pixel unit P12. Each pixel unit includes two R sub-pixels, two B sub-pixels, and two G sub-pixels, enabling the achievement of the panchromatic display, and being able to be used in the 2D display mode. Since the number of pixel units is twice the number of pixel units shown in FIG. 4A, the display effect is further improved. In addition, the pixel units P11 and P12 are also able to be controlled for time-sharing display, so that the pixel units like P11 divided from the pixel structure are able to be used for left eye display, and the pixel units like P12 divided from the pixel structure are able to be used for right eye display, thereby enabling the pixel structure to be applied to VR and 3D display technologies.

Figure 4C:
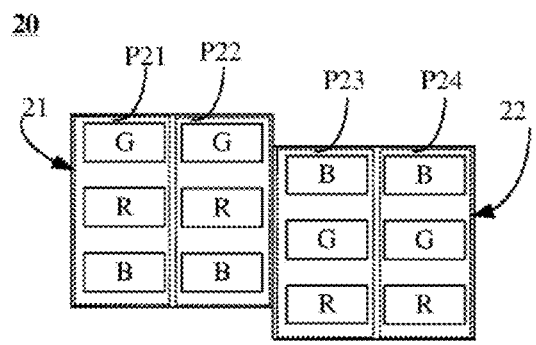

Referring to FIG. 4C, in an embodiment of the present disclosure, each pixel group 20 may be divided into four pixel units. Two columns of sub-pixels of the first pixel sub-group 21 are each divided into pixel units P21 and P22, and two columns of sub-pixels of the second pixel sub-group 22 are each divided into pixel units P23 and P24. Each pixel unit includes one R sub-pixel, one B sub-pixel and one G sub-pixel, enabling the achievement of the panchromatic display, and being able to be used in 2D display mode. Moreover, since the number of pixel units is twice the number of pixel units shown in FIG. 4B, the display effect is further improved. In addition, the pixel units P21 to P24 are also able to be controlled for time-sharing display, so that the pixel units such as P21 and P23 divided from the pixel structure (pixel units located at the left column of each sub-pixel group) are able to be used for left eye display, and the pixel units such as P22 and P24 divided from the pixel structure (pixel units located at the right column of each sub-pixel group) are able to be used for right eye display, thereby enabling the pixel structure to be applied to the VR and 3D display technologies.

In an embodiment of the present disclosure, some of the sub-pixels of the first pixel sub-group 21 and some of the sub-pixels of the second pixel sub-group 22 in each pixel group 20 are able to be divided into one pixel unit.

Figure 4D:
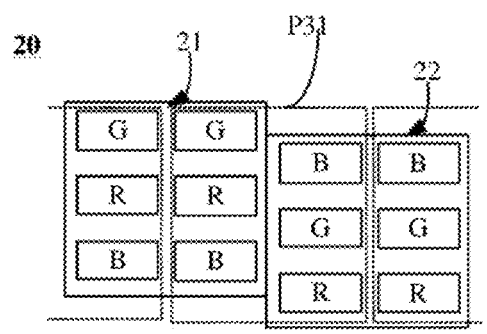

For example, referring to FIG. 4D, two adjacent sub-pixel columns of the first pixel sub-group 21 and the second pixel sub-group 22 in each pixel group 20 may be divided into one pixel unit P31. Each pixel unit 31 includes two R sub-pixels, two B sub-pixels, and two G sub-pixels, enabling the achievement of the panchromatic display, and being able to be used in 2D display mode. Moreover, since the number of pixel units is twice the number of pixel units shown in FIG. 4A, the display effect is further improved.

Figure 4E:
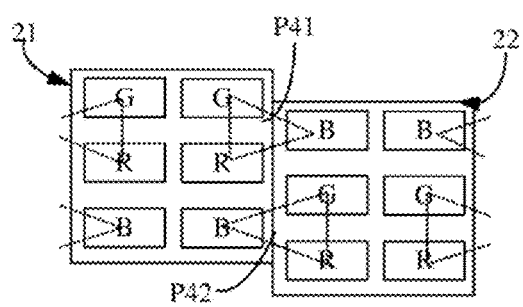

For another example, referring to FIG. 4E, in an embodiment of the present disclosure, the right sub-pixel of the first sub-pixel group of the first pixel sub-group 21 (such as the right G of 21 in FIG. 4E), the right sub-pixel of the second sub-pixel group of the first pixel sub-group 21 (such as the right R of 21 in FIG. 4E), and the left sub-pixel of the third sub-pixel group in the second pixel sub-group 22 (such as the left B in 22 in FIG. 4E), in each pixel group 20, are divided into one pixel unit P41. The right sub-pixel of the third sub-pixel group of the first pixel sub-group 21 (such as the right B of 21 in FIG. 4E), the left sub-pixels of the first sub-pixel group in the second pixel sub-group 22 (such as the left G of 22 in FIG. 4E), and the left sub-pixels of the second sub-pixel group in the second pixel sub-group 22 (such as the left R of 22 in FIG. 4E), in each pixel group 20, are divided into one pixel unit P42. The cooperation mode of the remaining sub-pixels with other pixel groups is similar to that of the sub-pixels in the pixel units P41 and P42, and reference can be made to the unclosed dotted line in FIG. 4E. Each pixel unit formed under such division manner includes one R sub-pixel, one B sub-pixel, and one G sub-pixel, enabling the achievement of panchromatic display and being able to be used in 2D display mode. Moreover, since the number of pixel units is more than the number of pixel units shown in FIG. 4A, the display effect is further improved. In addition, by using time-sharing control, pixel units such as P41 (the pixel units include two sub-pixels of the first sub-pixel group 21) divided from the pixel structure are able to be used for left eye display, and pixel units such as P42 (i.e., the pixel units include two sub-pixels of the second sub-pixel group 22) divided from the pixel structure are able to be used for right eye display, or pixel units such as P41 (the vertex angle of an isosceles triangle formed by such pixel units opens leftward) divided from the pixel structure are able to be used for left eye display, and pixel units such as P42 (the vertex angle of an isosceles triangle formed by the pixel units opens rightward) divided from the pixel structure are able to be used for right eye display, thereby enabling the pixel structure to be applied to the VR and 3D display technologies.

Figure 4F:
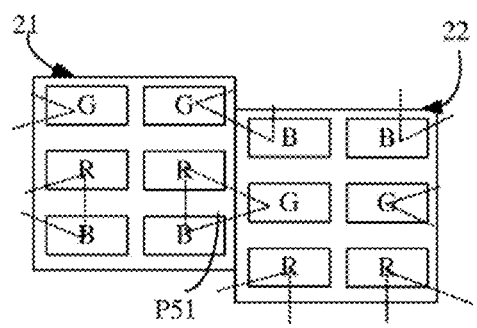

For another example, referring to FIG. 4F, the right sub-pixel of the second sub-pixel group of the first pixel sub-group 21 (such as the right R of 21 in FIG. 4F) and the right sub-pixel of the third sub-pixel group (such as the right B of 21 in FIG. 4F) of the first pixel sub-group 21, and the left sub-pixel of the first sub-pixel group in the second pixel sub-group 22 (such as the left G of 22 in FIG. 4F), in each pixel group 20, are divided into one pixel unit P51. The cooperation mode of the remaining sub-pixels in the pixel groups 20 with other sub-pixels refers to the cooperation mode of the sub-pixels in the pixel unit P51, specifically as shown in the unclosed dotted line of FIG. 4F. Under such division manner of the pixel units, each pixel unit P51 includes one R sub-pixel, one B sub-pixel, and one G sub-pixel, enabling the achievement of the panchromatic display and thus being able to be used in 2D display mode. Moreover, since the number of pixel units is more than the number of pixel units shown in FIG. 4A, the resolution is greatly improved.

In each of the above embodiments, the case that the sub-pixel is shared does not exist in each pixel group 20, that is, the case that two pixel units share a same sub-pixel does not exist. In other embodiments of the present disclosure, in the same pixel group 20, at least one sub-pixel is shared to form a corresponding pixel unit.

Figure 4G:
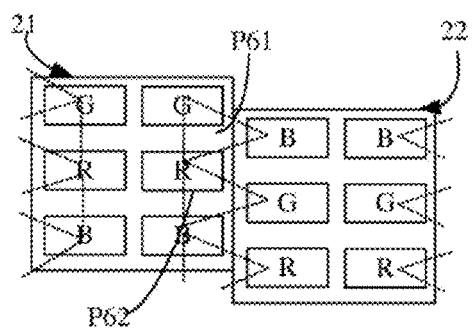

For example, referring to FIG. 4G, in each pixel group 20, the right sub-pixel R in the second sub-pixel group of the first pixel sub-group 21 is being shared by G over the said right sub-pixel R (i.e., the right sub-pixel in the first sub-pixel group of the first pixel sub-group 21) and the left sub-pixel G in the first sub-pixel group of the second pixel sub-group 22, thereby forming two pixel units P61 and P62. Similarly, the right B of the first pixel sub-group 21 is also shared by two G sub-pixels (one of which is not shown), and the cooperation mode of the remaining sub-pixels in the pixel group 20 with other sub-pixels is specifically shown in the unclosed dotted line of FIG. 4G, being similar to the cooperation mode of the sub-pixels in the two pixel units P61 and P62, which is not described in detail herein. Under such division manner of the pixel units, each pixel unit includes sub-pixels of three colors of R, B and G, enabling the achievement of the panchromatic display can be achieved and being able to be used in 2D display mode. Moreover, since the number of pixel units is more than the number of pixel units shown in FIG. 4A, the display effect is further improved. In addition, by using time-sharing control, pixel units such as P61 (G sub-pixels comprised in such pixel units are located in the right column) divided from the pixel structure are able to be used for right eye display, and pixel units such as P62 (i.e., G sub-pixels comprised in such pixel units are located in the left column) divided from the pixel structure are able to be used for left eye display, thereby enabling the pixel structure to be applied to the VR and 3D display technologies.

Figure 4H:
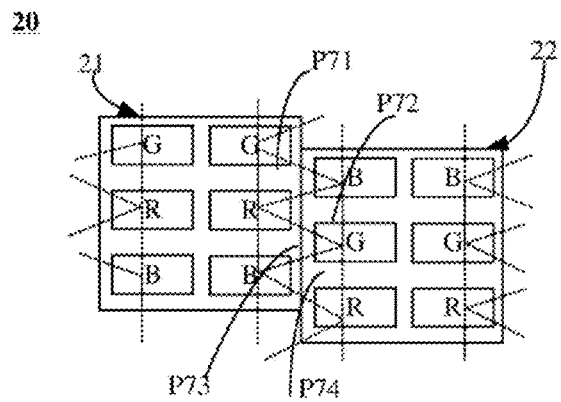
Figure 5:
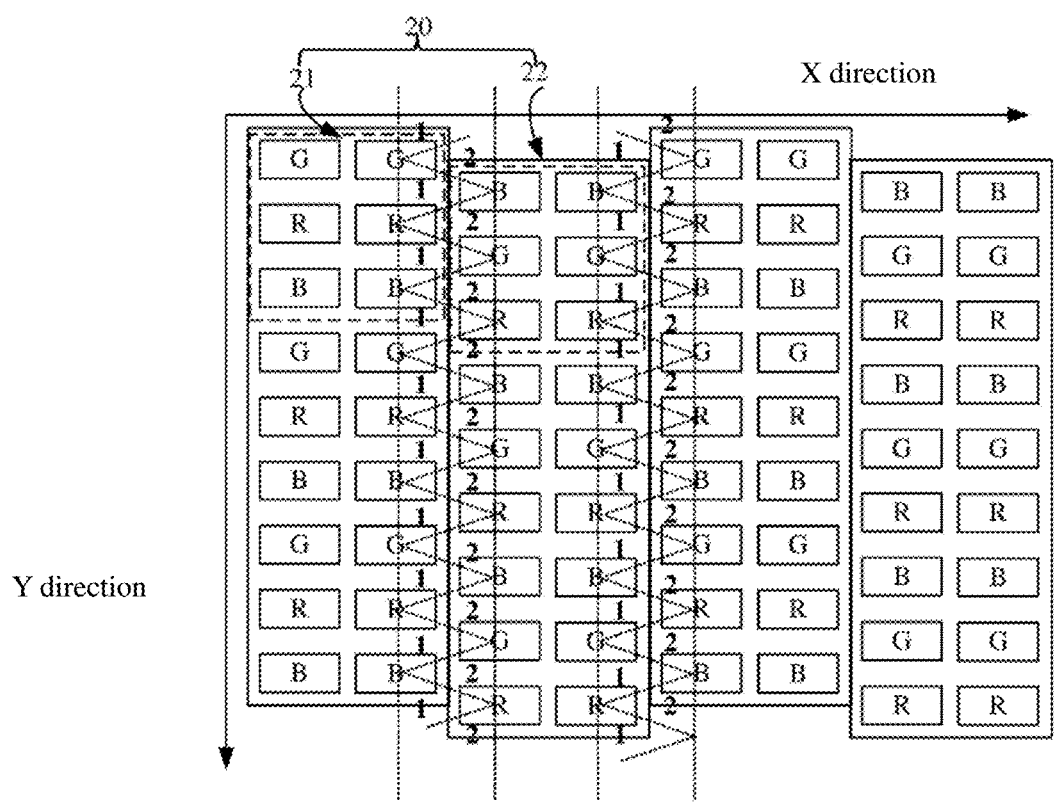
FIG. 5 is a schematic diagram of a pixel structure used for 3D display according to the first group of embodiments of the present disclosure.

For another example, referring to FIG. 4H, in each pixel group 20, the right sub-pixel R in the second sub-pixel group RR of the first pixel sub-group 21 and the left sub-pixel B in the third sub-pixel group BB of the second pixel sub-group 22 are shared by two diagonal G (i.e., the right sub-pixel G in the first sub-pixel group GG of the first pixel sub-group 21 and the left sub-pixel G in the first sub-pixel group of the second pixel sub-group 22), thereby forming two pixel units P71 and P72, and right sub-pixel B in the third sub-pixel group BB of the first pixel sub-group 21 and the left sub-pixel G in the first sub-pixel group GG in the second pixel sub-group 22 are shared by two diagonal R (i.e., the right sub-pixel R in the second sub-pixel group RR of the first pixel sub-group 21 and the left sub-pixel R in the second sub-pixel group of the second pixel sub-group 22), thereby forming two pixel units P73 and P74. The cooperation mode of the remaining sub-pixels in the first pixel sub-group 21 and the second pixel sub-group 22 with corresponding sub-pixels in the adjacent pixel group 20 is as shown in the dotted line of FIG. 4H, and is similar to the cooperation mode of the sub-pixels in the pixel units P71 to P74, which is not described in detail herein. Under such division manner of the pixel unit, each sub-pixel in the pixel group 20 is shared, and each divided pixel unit includes sub-pixels of three colors of R, B and G, enabling the achievement of the panchromatic display and the use in 2D display mode. Moreover, since the number of divided pixel units is more than the number of pixel units shown in FIG. 4A, the display effect is further improved. In addition, by using time-sharing control, pixel units such as P71 and P73 (the vertex angle of an isosceles triangle corresponding to such pixel units opens leftward) divided from the pixel structure are able to be used for left eye display, and pixel units such as P72 and P74 (I.e., the vertex angle of an isosceles triangle corresponding to such pixel units opens rightward) divided from the pixel structure are able to be used for right eye display, thereby enabling the pixel structure to be applied to the VR and 3D display technologies. Specifically, referring to FIG. 5, pixel units such as P71 and P73 are defined as "1", and pixel units such as P72 and P74 are defined as "2". The pixel units divided by the pixel group column formed by the second pixel sub-groups 22 cooperating with the adjacent pixel group columns formed by the first pixel sub-group 21 are arranged alternately in the form of "1" and "2". After the pixel structure is driven, the pixel units "1" are assigned to the first direction (X direction), and the pixel units "2" are assigned to the second direction (Y direction), so that the number of pixel units in the first direction and the second direction is greater than the number of pixel units shown in FIG. 4A. Therefore, the resolution is greatly improved. When the pixel structure shown in FIG. 2A becomes the pixel structure shown in FIG. 2B after rotating 90 degrees to the left, the leftward-rotated pixel units "1" are assigned to the first direction (Y direction), and leftward-rotated pixel units "2" are assigned to the second direction (X direction), enabling to achieve a similar display effect.

In other embodiments of the present disclosure, the division manner of the pixel units of the pixel structure may be a combination of the division manners of the pixel units in FIG. 4A to FIG. 4H when each sub-pixel group in the pixel structure contains three or more sub-pixels having a same color and each disposed adjacent to a corresponding sub-pixel. For example, when each sub-pixel group in the pixel structure has four sub-pixels and pixel sharing is existed, sub-pixels of two columns, next to each other, of the first pixel sub-group and the adjacent second pixel sub-group in the pixel structure are divided to form pixel units according to any division manner of pixel units of FIG. 4E to FIG. 4H, and the remaining sub-pixel columns of the two pixel sub-groups is divided to form pixel units according to the manner of FIG. 4B or FIG. 4C.

In addition, the display of each pixel unit is a result of mixing the display content (color, brightness, etc.) of each driven sub-pixel. Therefore, the display of each pixel unit is not only related to the type and number of sub-pixels constituting the pixel unit, but also related to the combination form of the sub-pixels constituting the pixel unit, and the driving signals required by the sub-pixels of different combination forms forming the pixel unit are also different. That is, after the pixel structure is divided into a plurality of pixel units, driving signals are provided for each of the sub-pixels according to the content that each pixel unit needs to display, so as to allocate corresponding brightness to the pixel units to make the pixel sharing manner achieve the optimal color mixing effect, thereby achieving an optimal display effect as well as an improved resolution. The above are only some specific sharing manners of sub-pixels, and it is also feasible to adopt other sharing manners.

The present disclosure also provides a display device, comprising the above pixel structure. The display device may be any product or component having a display function such as an OLED panel, a mobile phone, a tablet computer, a television, a display, a notebook computer, a digital photo frame, and a navigator. Since the display device of the present disclosure includes the foregoing pixel structure, the display device has a high display uniformity and good display quality.

According to a second group of embodiments of the present disclosure, in each of the first pixel sub-group and the second pixel sub-group of each pixel group, the number of first sub-pixel(s) is equal to the number of second sub-pixel(s), and the number of third sub-pixels is the sum of the number of first sub-pixel(s) and the number of second sub-pixel(s), the first sub-pixel(s) and the second sub-pixel(s) are arranged in a second direction to form a pixel group row. The third sub-pixels is consecutively arranged in the second direction to form another pixel group row adjacent to the pixel group row in the first direction. The another pixel group row in the first pixel sub-group and the another pixel group row in the second pixel sub-group are separated by the pixel group row in the first pixel sub-group or the second pixel sub-group, two adjacent pixel groups in the second direction are misaligned with each other. In such a pixel structure, adjacent pixel groups in the second direction are misaligned with each other, and the pixel distributions in the first direction and the second direction are relatively consistent, thereby enabling to greatly increase the uniformity of display. Moreover, Since the number of first sub-pixel(s) is equal to the number of second sub-pixel(s), and the number of third sub-pixels is the sum of the number of first sub-pixel(s) and the number of second sub-pixel(s), the first sub-pixel and the second sub-pixel can be shared by two corresponding third sub-pixels to form two pixel units, so that some of the pixel units of all divided pixel units, are able to be used for left eye display, and some of the pixel units of all divided pixel units are able to be used for right eye display by using time-sharing control, enabling the application of VR and 3D display. In addition, at least two sub-pixels of the same color are able to share a same evaporation opening, thereby reducing the difficulty of the mask manufacturing process and the evaporation process.

Figure 6A:
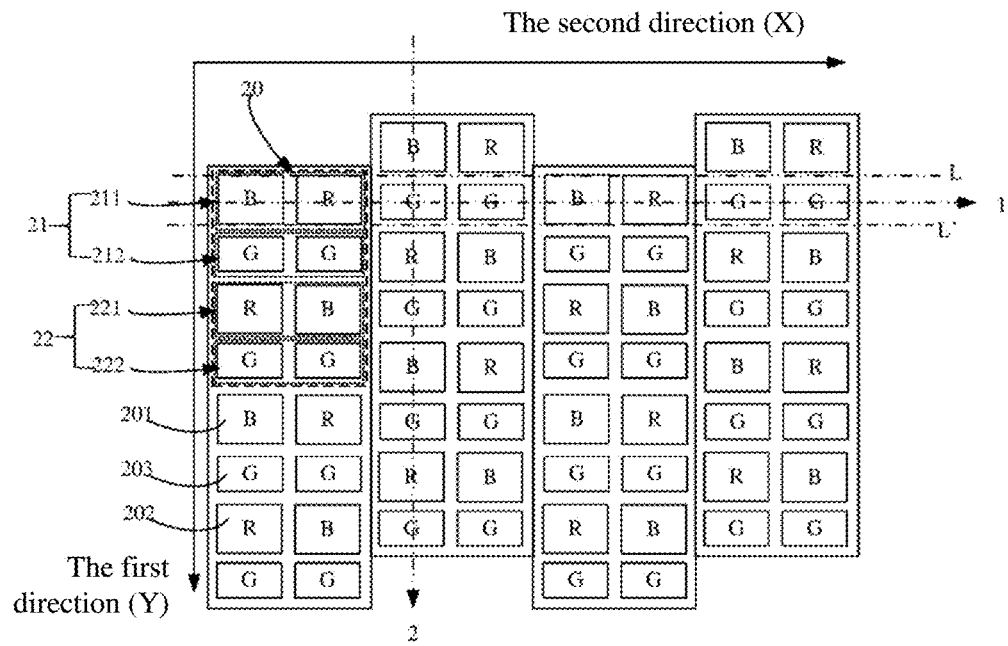
FIG. 6A to FIG. 6G are schematic diagrams showing the arrangement of pixel structures according to a second group of embodiments of the present disclosure.
Figure 6B:
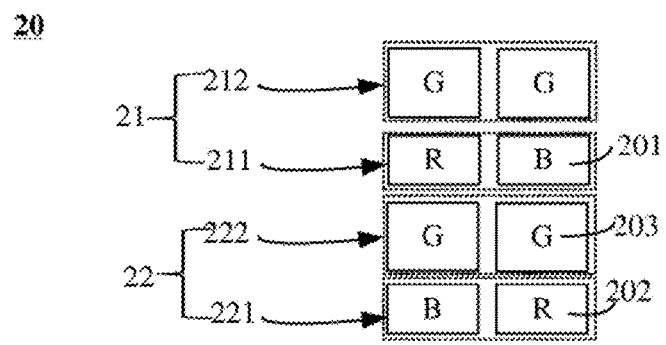
Figure 6C:
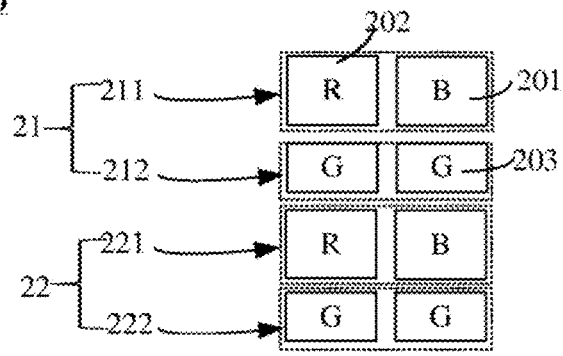
Figure 6D:
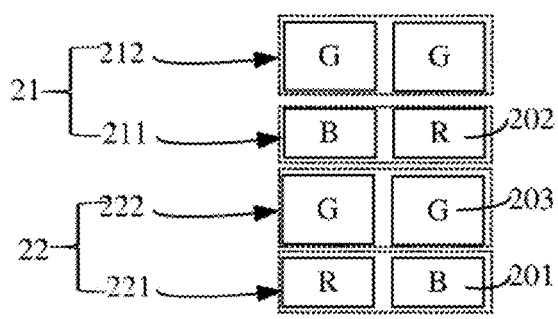

Referring to FIG. 6A to FIG. 6G, an embodiment of the present disclosure provides a pixel structure, comprising a plurality of pixel groups 20 arranged in an array, each pixel group 20 comprising a first pixel sub-group 21 and a second pixel sub-group 22 disposed adjacent to each other (disposed adjacent to each other in the same column as shown in FIG. 6A) in a first direction (Y direction as shown in FIG. 6A). Each of the first pixel sub-group 21 and the second pixel sub-group 22 comprises sub-pixels of three different color, i.e., first sub-pixel(s) 201, second sub-pixel(s) 202, and third sub-pixels 203; and two adjacent pixel groups 20 in the second direction are misaligned with each other (two adjacent columns of pixel groups are misaligned as shown in FIG. 6A). In each pixel sub-group, the number of first sub-pixel(s) 201 is equal to the number of second sub-pixel(s) 202, and the number of third sub-pixels 203 is the sum of the number of first sub-pixel(s) 201 and the number of second sub-pixel(s) 202. The first sub-pixel(s) 201 and the second sub-pixel(s) 202 are arranged in the second direction (X direction as shown in FIG. 6A) to form a pixel group row (e.g., 211 and 221 in FIG. 6A, FIG. 6E, and FIG. 6F), and the third sub-pixels 203 are consecutively arranged in the second direction to form another pixel group row (e.g., 212 and 222 in FIG. 6A, FIG. 6E, and FIG. 6F) adjacent to the pixel group row in the first direction. Moreover, the another pixel group row (e.g., 212 in FIG. 6A, FIG. 6E, and FIG. 6F) in the first pixel sub-group 21 and the another pixel group row (e.g., 222 in FIG. 6A, FIG. 6E, and FIG. 6F) in the second pixel sub-group 22 are separated by the pixel group row in the first pixel sub-group or the second pixel sub-group. For example, in a pixel group 20 of the pixel structure as shown in FIG. 6A, the another pixel group row 212 in the first pixel sub-group 21 and the another pixel group row 222 in the second pixel sub-group 22 are separated by the pixel group row 221 in the second pixel sub-group 22. In a pixel group 20 as shown in FIG. 6B, the another pixel group row 212 in the first pixel sub-group 21 and the another pixel group row 222 in the second pixel sub-group 22 are separated by the pixel group row 211 in the first pixel sub-group 22.

The three colors corresponding to the first sub-pixel(s) 201, the second sub-pixel(s) 202, and the third sub-pixels 203 may be three primary colors of red (R), green (G), and blue (B), and correspondingly, the first sub-pixel 201 may be a blue sub-pixel (B), the second sub-pixel may be a red sub-pixel (R), and the third sub-pixel may be a green sub-pixel (G). In this case, the number of red sub-pixel(s) is equal to the number of blue sub-pixel(s), and the number of green sub-pixels is the sum of the number of red sub-pixel(s) and the number of blue sub-pixel(s), that is, twice the number of red sub-pixels, thereby improving display brightness and service life of the pixel structure.

Figure 6E:
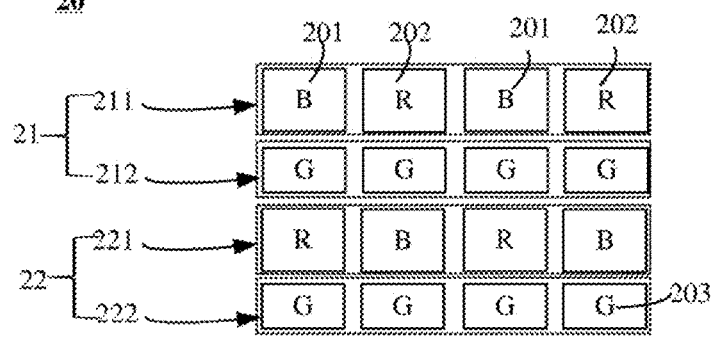
Figure 6F:
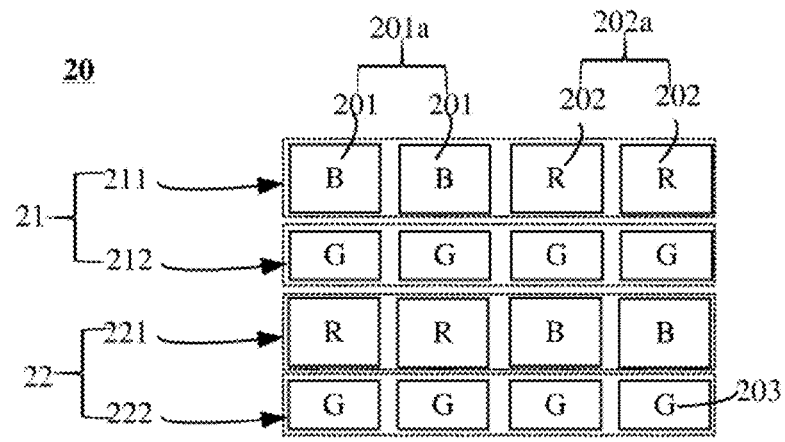

In each pixel sub-group, the number of each of the first sub-pixel(s) 201 and the second sub-pixel(s) 202 may be one, as shown in FIG. 6A to FIG. 6D and FIG. 6G, or may be plural, for example, the number of the first sub-pixel(s) 201 and the second sub-pixel(s) 202 in each pixel sub-group as shown in FIG. 6E and FIG. 6F is two. The specific arrangements of pixel structures in the case where the number of the first sub-pixel(s) 201 in each pixel sub-group is one or two will be separately described in detail below with reference to the corresponding drawings.

Referring to FIG. 6A to FIG. 6D, each of the first pixel sub-group 21 and the second pixel sub-group 22 in each pixel group 20 includes one first sub-pixel 201, one second sub-pixel 202, and two third sub-pixels 203. In the first pixel sub-group 21, the first sub-pixel 201 and the second sub-pixel 202 are consecutively arranged in a same row (i.e., in the second direction) to form a pixel group row 211, the pixel group row 211 is shown by the first row BR in FIG. 6A, the second row RB in FIG. 6B, the first row RB in FIG. 6C or the second row BR in FIG. 6D, and the two third sub-pixels 203 are consecutively arranged in the same row to form another pixel group row 212, the pixel group row 212 and the pixel group row 211 being disposed adjacent to each other in the column direction (i.e., in the first direction), the pixel group row 212 is shown by the second row GG in FIG. 6A, the first row GG in FIG. 6B, the second row GG in FIG. 6C or the first row GG in FIG. 6D. In the second pixel sub-group 22, the first sub-pixel 201 and the second sub-pixel 202 are consecutively arranged in the same row (i.e., in the second direction) to form a pixel group row 221, and the order of the first sub-pixel 201 and the second sub-pixel 202 in the pixel group row 221 may be the same as or different from the order of the first sub-pixels 201 and the second sub-pixels 202 forming the pixel group row 211 of the first pixel sub-group 21 in the same pixel group 20. The pixel group row 221 may be the third row BR in FIG. 6A, the fourth row RB in FIG. 6B, the third row RB in FIG. 6C, or the fourth row RB in FIG. 6D. The two third sub-pixels 203 are consecutively arranged in the same row to form another pixel group row 222, the pixel group row 222 and the pixel group row 221 being disposed adjacent to each other in the column direction (i.e., in the first direction), the pixel group row 222 as the fourth row GG in FIG. 6A, the third row GG in FIG. 6B, the fourth row GG in FIG. 6C, or the third row GG in FIG. 6D. In other words, each of the pixel groups 20 includes two first sub-pixels 201 of the same color, two second sub-pixels 202 of the same color, and four third sub-pixels 203 of the same color, a total of eight sub-pixels. The colors of the first sub-pixels 201, the second sub-pixels 202, and the third sub-pixels 203 are different from each other, and the eight sub-pixels are arranged in an array of four rows and two columns. In the array of four rows and two columns, every two third sub-pixels 203 are arranged in a row, one first sub-pixel 201 and one second sub-pixel 202 being arranged in a row, two rows of third sub-pixels 203 being separated by a row formed by one first sub-pixel 201 and one second sub-pixel 202. The two first sub-pixels 201 may be located on the same column of the array of four rows and two columns, or may be located on different columns.

Referring to FIG. 6E and FIG. 6F, each of the first pixel sub-group 21 and the second pixel sub-group 22 in each pixel group 20 includes two first sub-pixels 201, two second sub-pixels 202, and four third sub-pixels 203. In the first pixel sub-group 21, the two types of sub-pixels, i.e. the first sub-pixels 201 and the second sub-pixels 202, may be in the same row (i.e., in the second direction) and are consecutively and alternately arranged to form a pixel group row 211, as shown in the first row BRBR in FIG. 6E, or the two types of sub-pixels are arranged in pairs side by side in a row (i.e., in the second direction) to form two sub-pixel groups, i.e., the first sub-pixel group 201a and the second sub-pixel group 202a, the first sub-pixel group 201a and the second sub-pixel group 202a being consecutively arranged in the same row to form a pixel group row 211, as shown in the first row BBRR in FIG. 6F; the four third sub-pixels 203 are consecutively arranged in the same row to form another pixel group row 212, the pixel group row 212 and the pixel group row 211 being disposed adjacent to each other in the column direction (i.e., in the first direction), the pixel group row 212 as the second row GGGG in FIG. 6E and FIG. 6F. In the second pixel sub-group 22, the arrangement of the first sub-pixels 201 and the second sub-pixels 202 is similar to the arrangement in the first pixel sub-group 21. That is, when the first sub-pixels 201 and the second sub-pixels 202 in the first pixel sub-group 21 are consecutively and alternately arranged in the same row, the first sub-pixels 201 and the second sub-pixels 202 in the second pixel sub-group 22 are also consecutively and alternately arranged in the same row to form a pixel group row 221, and the order of the first sub-pixels 201 and the second sub-pixels 202 in the pixel group row 221 may be identical to (not shown) or different from (the third row RBRB as shown in FIG. 6E) the order of the first sub-pixels 201 and the second sub-pixels 202 in the pixel group row 211 of the first pixel sub-group 21, and when the first sub-pixels 201 and the second sub-pixels 202 in the first pixel sub-group 21 are in the same row and consecutively arranged in a sub-pixel group, the first sub-pixels 201 and the second sub-pixels 202 are arranged in pairs side by side in a row (i.e., in the second direction) to form two sub-pixel groups, i.e., the first sub-pixel group 201a and the second sub-pixel group 202a, the first sub-pixel group 201a and the second sub-pixel group 202a being consecutively arranged in the same row to form a pixel group row 221, the order of the first sub-pixel group 201a and the second sub-pixel group 202a in the pixel group row 221 being identical to (not shown) or different from (the third row RRBB in FIG. 6F) the order of the first sub-pixel group 201a and the second sub-pixel group 202a in the pixel group row 211 in the first pixel sub-group 21. In other words, each of the pixel groups 20 includes four first sub-pixels 201 of the same color, four second sub-pixels 202 of the same color, and eight third sub-pixels 203 of the same color, a total of 16 sub-pixels. The colors of the first sub-pixels 201, the second sub-pixels 202, and the third sub-pixels 203 are different from each other, and the 16 sub-pixels are arranged in an array of four rows and four columns. In the array of four rows and four columns, every four third sub-pixels 203 are arranged in a row, two first sub-pixels 201 and two second sub-pixels 202 are arranged in a row, two rows of third sub-pixels 203 being separated by a row formed by two first sub-pixels 201 and two second sub-pixels 202. Two first sub-pixels 201 may be located on the same column of the array of four rows and four columns, or may be located on different columns.

When the number of the first sub-pixels 201 and the second sub-pixels 202 is more than two, i.e. when the total number of sub-pixels in each pixel group 20 is greater than 16, the first sub-pixels 201 and the second sub-pixels 202 in each pixel sub-group may be consecutively and alternately arranged in the same row (i.e., in the second direction), or the equal number of identical sub-pixels are consecutively arranged in a row (i.e., in the second direction) to form two sub-pixel groups, i.e., a first sub-pixel group 201a (e.g., including two or more adjacent first sub-pixels 201 in the same row) and a second sub-pixel group 202a (e.g., including two or more adjacent second sub-pixels 202 in the same row), and the first sub-pixel group 201a and the second sub-pixel group 202a may be consecutively and alternately arranged in the same row (i.e., in the second direction). Regardless of the form in which the first sub-pixels 201 and the second sub-pixels 202 are arranged in rows, each pixel group consists of four pixel group rows, where two pixel group rows are formed by the third sub-pixels 203 consecutively arranged in the second direction, and the two pixel group rows are separated by a pixel group row formed by the first sub-pixels 201 and the second sub-pixels 202 arranged in the second direction, i.e., two third sub-pixels 203 in the first direction are separated by the first sub-pixel 201 or the second sub-pixel 202. Moreover, it can be seen from FIG. 6A to FIG. 6F that the sequential order of the pixel group row where the third sub-pixels 203 are located and the sequential order of the pixel group row where the first sub-pixels 201 are located in the first direction (such as the column in FIG. 6A) is not limited.

Figure 6G:
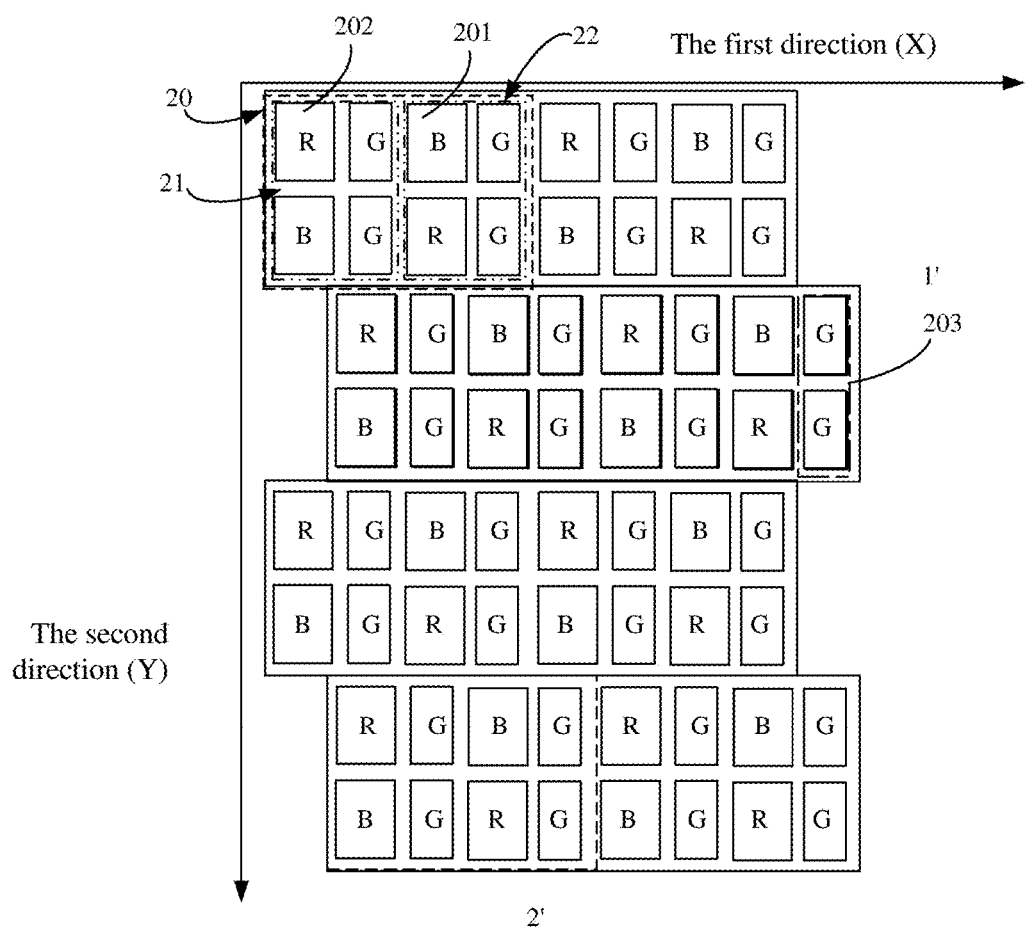

In addition, according to the actual design and production needs, the pixel structure formed by the pixel groups in FIG. 6A to FIG. 6F arranged in an array may be rotated by 90 degrees to the left or right, and certainly, may also be rotated by 180 degrees. For example, a pixel structure as shown in FIG. 6G can be obtained by rotating FIG. 6A by 90 degrees to the left. As shown in FIG. 6G, the pixel structure comprises a plurality of pixel groups 20 arranged in an array, each pixel group 20 comprising a first pixel sub-group 21 and a second pixel sub-group 22 disposed adjacent to each other in the X direction (that is, arranged in a row) and each including sub-pixels of three different color, i.e., a first sub-pixel 201, a second sub-pixel 202, and a third sub-pixel 203, two adjacent pixel groups 20 in the Y direction (i.e., two adjacent rows) being misaligned with each other.

In addition, the shape and size of the first sub-pixel 201, the second sub-pixel 202, and the third sub-pixel 203 can be adaptively adjusted according to different service lives of each sub-pixel and product display requirements. Preferably, in the same pixel group, all of the sub-pixels have the same shape and size, so that the same mask can be used three times to evaporate sub-pixels of three colors to minimize the cost; or, the sub-pixels of two colors have the same shape and size, and the sub-pixels of another color are different in shape and size from the sub-pixels of two colors, so that the same mask can be evaporated twice to fabricate the sub-pixels of two colors to save the cost; or, the sub-pixels of three colors have the same shape but different sizes. For example, in the same pixel group, the shapes of the first sub-pixel 201, the second sub-pixel 202, and the third sub-pixel 203 are all strips, and the strip may be a right-angled rectangle, a rounded rectangle, and a notched rectangle (at least one of the four rectangular angles is not a right angle and a rounded angle), and a length-width ratio of the rectangle corresponding to the strip is 1:1, 2:1, 3:1, 3:2, or 4:3, to facilitate optimizing wiring space. All of the first sub-pixels 201 and the second sub-pixels 202 are identical in shape and size, so that the first sub-pixels 201 and the second sub-pixels 202 can be fabricated by offsetting the same mask (FMM), to reduce the process cost. All of the third sub-pixels 203 are identical in shape and size, and the size of the third sub-pixel 203 is smaller than the size of the first sub-pixel 201. Specifically, the size of each third sub-pixel 203 in the row direction is equal to the size of each first sub-pixel 201 in the row direction, and the size of each third sub-pixel 203 in the column direction is smaller than the size of each first sub-pixel 201 in the column direction. In two pixel groups 20 adjacent to each other in the second direction and misaligned with each other, the region defined by each of the another pixel group rows in one of the two pixel groups at least partially coincides with the region defined by a corresponding pixel group rows in the other one of the two pixel groups. Specifically referring to FIG. 6A, the size of each third sub-pixel 203 in the column direction (such as the width of the G rectangle in FIG. 6A) is equal to the half size of each first sub-pixel 201 in the column direction (such as the width of the R rectangle in FIG. 6A). The two adjacent columns of pixel groups 20 are misaligned with each other, and all the pixel groups in the odd-numbered columns are in a same height (that is, the tops are on the same horizontal line) with the pixel groups in the even-numbered columns being in a same height (that is, the tops are on the same horizontal line). In two columns of pixel groups 20 misaligned with each other, a region defined by (each pixel grow row formed by third sub-pixels 203 arranging in row (such as GG in the second row of the second column of pixel groups in the left in FIG. 6A) one of the two columns of pixel groups 20 is completely contained in a row-width region LL' defined by the pixel group rows (such as BR in the first row of the first column of pixel groups in the left in FIG. 6A) formed by the corresponding first sub-pixels 201 in the adjacent one of the two columns of pixel groups, so that R, G and B sub-pixels are arranged in the row direction and the column direction, and the number of sub-pixels arranged in the row is equal to the number of sub-pixels arranged in the column, as shown by dotted arrow 1 and dotted arrow 2 in FIG. 6A. That is, the number of sub-pixels distributed in the row direction and the column direction is consistent, thereby enabling to achieve the display effect of high uniformity.

In addition, a certain deviation is allowed between the actual shapes (and sizes) of various products and the design shapes (and sizes) in actual production. In general, as long as the actual shapes (and sizes) of the product is within the allowable deviation range of the design shapes (and sizes), the requirements for use can be met. For example, the shapes of the first sub-pixel 201, the second sub-pixel 202, and the third sub-pixel 203 may also be rectangle-like shapes, such as an approximately rectangular or approximately square trapezoid. The trapezoid may be an isosceles trapezoid or a non-isosceles trapezoid, and may be a trapezoid, an inverted trapezoid, a trapezoid rotating 90 degrees to the left, or a trapezoid rotating 90 degrees to the right. In a preferred embodiment, the trapezoid is an isosceles trapezoid, and the difference in size between the upper base and the lower base of the isosceles trapezoid is less than 10% of the length of the lower base, and an angle between the waist and the upper side of the isosceles trapezoid is greater than 90 degrees and less than 100 degrees, and an angle between the waist and the lower base of the isosceles trapezoid is greater than 80 degrees and less than 90 degrees. In this way, the shapes of the first sub-pixel 201, the second sub-pixel 202, and the third sub-pixel 203 are approximately square (within the allowable deviation range), and thus a better arrangement effect can still be obtained.

Optionally, the misaligned two columns of pixel groups 20 are misaligned at least one pixel group row of a pixel sub-group. For example, in the pixel structure shown in FIG. 6A, the first column of pixel groups and the second column of pixel groups are misaligned more than one pixel group row of the second column of pixel groups, that is, the first BR row, and a partial gap between the first BR row and the adjacent GG row below the said first BR row.

In the pixel structure of the present disclosure, each of the first sub-pixel 201, the second sub-pixel 202, and the third sub-pixel 203 includes a light-emitting region (a display region) and a non-light-emitting region (a non-display region). The light-emitting region of each sub-pixel includes a cathode, an anode, and an electroluminescent layer (also called an organic light-emitting layer), and the electroluminescent layer is located between the cathode and the anode and configured to generate light of a predetermined color to achieve display. Generally, in the pixel structure of the present disclosure, the evaporation process is performed three times to form electroluminescent layers of corresponding colors (e.g., red, green, or blue) in the light-emitting regions of the corresponding sub-pixels, respectively.

Figure 7A:
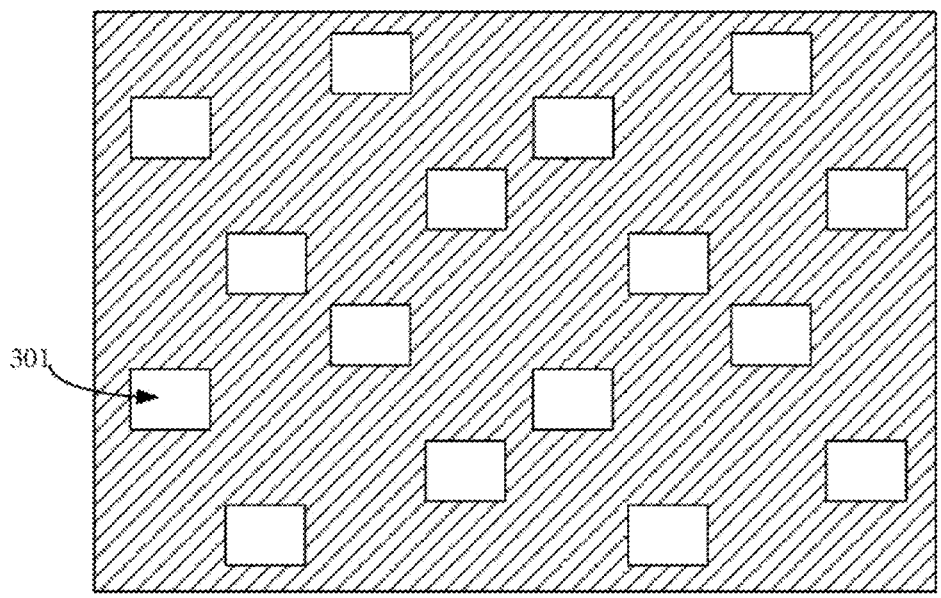
FIG. 7A is a schematic diagram of an FMM for preparing a first sub-pixel and a second sub-pixel according to the second group of embodiments of the present disclosure.

FIG. 7A is a schematic diagram of an FMM for evaporation of a first sub-pixel 201 corresponding to the pixel structure shown in FIG. 6A or 6E. As shown in FIG. 7A, the mask has a plurality of evaporation openings 301, the size of each evaporation opening 301 corresponding to the size of one of the first sub-pixels 201 in FIG. 6A or the size of two adjacent first sub-pixels 201 in the same row of FIG. 6E (that is, the two adjacent first sub-pixels 201 in FIG. 6E share one evaporation opening 301, enabling to reduce the space occupation and facilitate reduction of the process difficulty and increase the PPI). Since the first sub-pixels 201 (or the second sub-pixel 202) of the same color in the odd-numbered row and the even-numbered row as well as in the odd-numbered column and the even-numbered column in FIG. 6A are not vertically aligned, but are staggered (shifted) from each other, the evaporation openings 301 on the evaporation mask (the FMM) for forming the first sub-pixels 201 (or the second sub-pixel 202) are also staggered. Thus, the strength of the FMM is able to be increased, the problems such as warping and fracture of the FMM are able to be avoided as much as possible, and the defects affecting the evaporation quality such as dizzy and offset of the evaporation film are able to be reduced. In the case that the first sub-pixel and the second sub-pixel have the same shape and size, a same mask is able to be shared in an offset manner to evaporate each of the first sub-pixel and the second sub-pixel, so as to save costs.

Figure 7B:
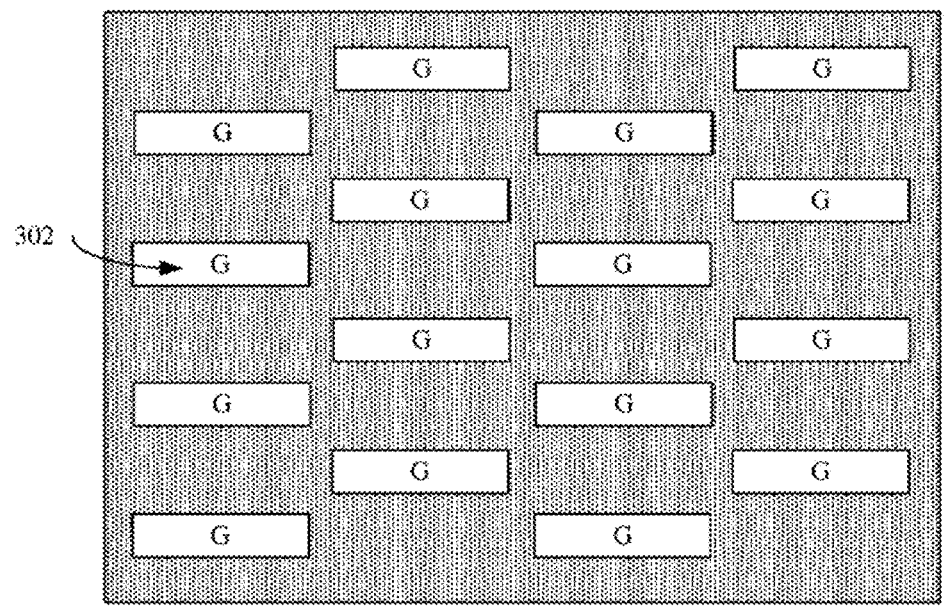
FIG. 7B is a schematic diagram of an FMM for preparing a third sub-pixel according to the second group of embodiments of the present disclosure.

FIG. 7B is a schematic diagram of an FMM for evaporation of a third sub-pixel 203 corresponding to the pixel structure shown in FIG. 6A, FIG. 6E, or FIG. 6F. As shown in FIG. 7B, the mask has a plurality of evaporation openings 302, the size of each of the plurality of evaporation openings 302 corresponding to the size of the third sub-pixels 203 of the same color in FIG. 6A, FIG. 6E, or FIG. 6F, each of the evaporation openings 302 corresponding to two adjacent third sub-pixels 203 in the same row of the corresponding pixel sub-group of FIG. 6A, FIG. 6E, and FIG. 6F, i.e., two adjacent third sub-pixels 203 share one evaporation opening 302, or each of the evaporation openings 302 corresponding to four third sub-pixels 203 in the same row of the corresponding pixel sub-group in FIG. 6E and FIG. 6F, i.e., the four third sub-pixels 203 share one evaporation opening 302, thereby reducing space occupation, increasing the aperture ratio to improve the PPI, or making the existing opening larger without increasing the openings to facilitate reduction of the process difficulty. In addition, since two adjacent columns of pixel groups are misaligned with each other, the evaporation openings 302 on the evaporation mask (the FMM) for forming the third sub-pixels 203 are also staggered. Thus, the strength of the FMM is able to be increased, the problems such as warping and fracture of the FMM is able to be avoided as much as possible, and the defects affecting the evaporation quality such as dizzy and offset of the evaporation film are able to be reduced.

The pixel structures of the present disclosure are arranged in units of "pixel group 20" and misaligned in columns, and the structure thereof changes greatly with respect to the customary pixel structure shown in FIG. 1A. Therefore, the division of pixel units (or the driving method for display) also changes, and each of the divided pixel units includes three sub-pixels, i.e., the first sub-pixel 201, the second sub-pixel 202, and the third sub-pixel 203. The pixel structure of the present disclosure is able to be used for 2D display, and is further able to be used for 3D display by means of time-sharing control. The specific division manner of the pixel units for the pixel structure of the present disclosure will be described in detail below taking the pixel structure shown in FIG. 6A as an example, where the first sub-pixel 201 takes B as an example, and the second sub-pixel takes R as an example, and the third sub-pixel 203 takes G as an example.

Figure 8A:
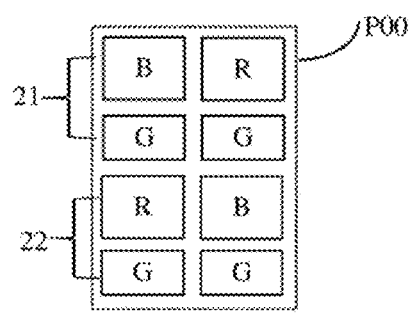
FIG. 8A to FIG. 8J are schematic diagrams showing division of pixel units according to the second group of embodiments of the present disclosure.

Referring to FIG. 8A, in an embodiment of the present disclosure, each pixel group may be divided into one pixel unit P00, i.e., each pixel unit P00 includes two R, two B, and four G. Each pixel unit in such division manner of pixel units includes sub-pixels of three colors of R, G and B, enabling the achievement of a panchromatic display, being able to be used in the 2D display mode and having an improved PPI and a better display effect due to a larger number of the sub-pixels.

In an embodiment of the present disclosure, each pixel group may be divided into two pixel units, each of the pixel unit including one R, one B, and two G. Specifically, for example, in FIG. 8B, the first pixel sub-group 21 of one pixel group is divided into one pixel unit P11, and the second pixel sub-group 22 is divided into another pixel unit P12, or for example, in FIG. 8C, the first column of each pixel group is divided into one pixel unit P21, and the second column is divided into another pixel unit P22. Under such division manner of the pixel units, each pixel unit includes one R, one B, and two G, enabling the achievement of the panchromatic display, and being able to be used in the 2D display mode. Moreover, since the number of pixel units is twice the number of pixel units shown in FIG. 8A, the resolution is greatly improved. In addition, the pixel units P11 and P12 can also be controlled for time-sharing display, so that the pixel units such as P11 divided from the pixel structure are able to be used for left eye display, and the pixel units such as P12 divided from the pixel structure are able to be used for right eye display, or the pixel units P21 and P22 are controlled for time-sharing display, so that the pixel units such as P21 in the pixel structure are able to be used for left eye display, and the pixel units such as P22 divided from the pixel structure are able to be used for right eye display, thereby enabling the pixel structure to be applied to the VR and 3D display technologies.

Figure 8B:
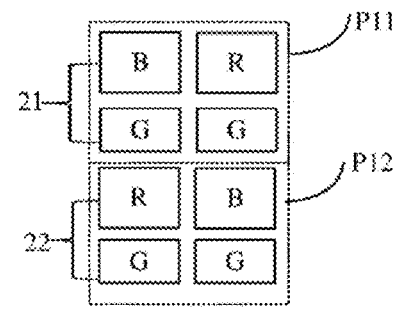
Figure 8C:
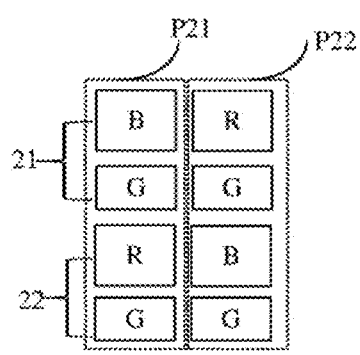
Figure 8D:
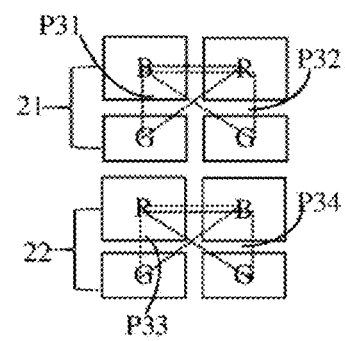

Referring to FIG. 8D, in an embodiment of the present disclosure, a pixel group is divided into four pixel units, in which the BR of the first row (i.e., a pixel group row of the first pixel sub-group 21) are shared by each of the two G of the second row (i.e., another pixel group row of the first pixel sub-group 21) to form pixel units P31 and P32, i.e. one first sub-pixel and one second sub-pixel adjacent in the second direction (row direction) are shared by one third sub-pixel adjacent to the first sub-pixel in the first direction (column direction) and another one third sub-pixel adjacent to the second sub-pixel in the first direction (column direction). The RB of the third row (i.e., a pixel group row of the second pixel sub-group 22) are shared by each of the two G of the fourth row (i.e., another pixel group row of the second pixel sub-group 22) to form the pixel units P33 and P34, i.e. one first sub-pixel and one second sub-pixel adjacent in the second direction (row direction) are shared by one third sub-pixel adjacent to (with the lower side adjacent to the first sub-pixel) the first sub-pixel in the first direction (column direction) and another one third sub-pixel adjacent to (with the lower side adjacent to the second sub-pixel) the second sub-pixel in the first direction (column direction). Each of the pixel units P31, P32, P33, and P34 includes one R, one B, and one G. Such division manner of pixel unit enables to achieve the panchromatic display, and be used for the 2D display mode. Moreover, since the number of pixel units is twice the number of pixel units shown in FIG. 8B and FIG. 8C, the resolution is greatly improved. In addition, the pixel units can also be controlled for time-sharing display, so that the pixel units such as P31 and P33 (that is, the third sub-pixels 203 included in the pixel units are located on the left column of the pixel group column, or the third sub-pixels 203 included in the pixel units are located on the same column) divided from the pixel structure are able to be used for left eye display, and the pixel units such as P32 and P34 (that is, the third sub-pixels 203 included in the pixel units are located on the right column of the pixel group column) divided from the pixel structure are able to be used for right eye display, or the pixel units such as P31 and P33 (that is, the third sub-pixels 203 included in the pixel units are located on the same row) divided from the pixel structure are able to be used for left eye display, and the pixel units such as P32 and P34 (that is, the third sub-pixels 203 included in the pixel units are located on the same row) divided from the pixel structure are able to be used for right eye display, thereby enabling the pixel structure to be applied to the VR and 3D display technologies.

Figure 8E:
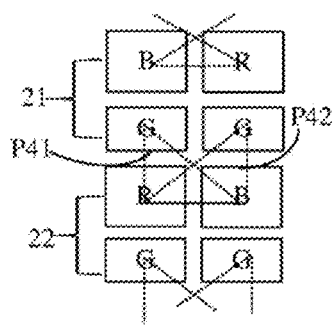

Referring to FIG. 8E, in an embodiment of the present disclosure, a certain pixel group in a column of pixel groups is used together with adjacent pixel groups below and over the certain pixel group to divide pixel units. Specifically, B and R of the first row in a pixel group (i.e., a pixel group row of the first pixel sub-group 21 of the pixel group) are shared by two G (not shown) of the fourth row in adjacent pixel group below the pixel group, to form two pixel units (not shown). Two G of the second row in the pixel group (i.e., another pixel group row of the first pixel sub-group 21 of the pixel group) shares R and B of the third row (i.e., the pixel group row of the second pixel sub-group 22 of the pixel group) to form two pixel units P41 and P42, that is, one first sub-pixel and one second sub-pixel adjacent in the second direction (row direction) are shared by one third sub-pixel adjacent to (with the upper side adjacent to the first sub-pixel) the first sub-pixel in the first direction (column direction) and another one third sub-pixel adjacent to (with the upper side adjacent to the second sub-pixel) the second sub-pixel in the first direction (column direction). The two G of the fourth row in the pixel group (i.e., another pixel group row of the second pixel sub-group 22 of the pixel group) share the BR (not shown) in the first row of an adjacent pixel group below the pixel group, to form two pixel units (not shown). Each of the formed pixel units includes one R, one B, and one G, enabling the achievement of a panchromatic display, being able to be used in the 2D display mode. Moreover, since the number of pixel units is larger than that of FIG. 8A, the resolution is relatively high. In addition, the pixel units can also be controlled for time-sharing display, so that the pixel units such as P41 divided from the pixel structure (that is, the sub-pixels G included in the pixel units are located on the left columns of the columns of pixel groups, or the sub-pixels G included in the pixel units are located on the same column) are able to be used for left eye display, and the pixel units such as P42 divided from the pixel structure (that is, the sub-pixels G included in the pixel units are located on the right columns of the columns of pixel groups) are able to be used for right eye display, thereby enabling the pixel structure to be applied to the VR and 3D display technologies.

Figure 8F:
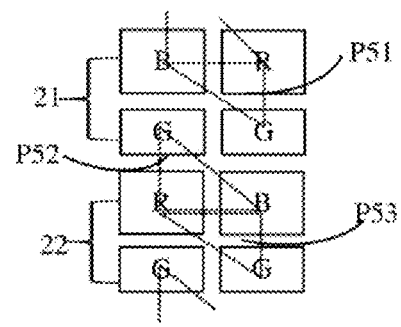

Referring to FIG. 8F, in an embodiment of the present disclosure, a certain pixel group in a column of pixel groups is used together with adjacent pixel groups (not shown) below and over the certain pixel group to divide the pixel unit. Specifically, B and R of the first row in a pixel group (i.e., a pixel group row of the first pixel sub-group 21 of the pixel group) are shared by G (not shown) in the left column of the fourth row in adjacent pixel group (not shown) over the pixel group and G in the right column of the second row of the pixel group (i.e., another pixel group row of the first pixel sub-group 21 of the pixel group), to form two pixel units, one of which is labeled as P51 in the pixel unit of the pixel group. G in the left column of the second row in the pixel group (i.e., another pixel group row of the first pixel sub-group 21 of the pixel group) and G in the right column of the fourth row in the pixel group (i.e., another pixel group row of the second sub-group 22 of the pixel group) share RB of the third row (i.e., the pixel group row of the second pixel sub-group 22 of the pixel group) in the pixel group to form two pixel units P52 and P53, that is, one first sub-pixel and one second sub-pixel adjacent in the second direction (row direction) are shared by one third sub-pixel adjacent to (with the lower side adjacent to the first sub-pixel) the first sub-pixel in the first direction (column direction) and another third sub-pixel adjacent to (with the upper side adjacent to the second sub-pixel) the second sub-pixel in the first direction (column direction). G in the left column of the fourth row in the pixel group (i.e., another pixel group row of the second pixel sub-group 22 of the pixel group) and G (not shown) in the right column of the second row in adjacent pixel group below the pixel group share B (not shown) and R (not shown) in the first row of adjacent pixel group (not shown) below the pixel group, to form two pixel units (not shown). Therefore, each of the formed pixel units includes one R, one B, and one G, enabling the achievement of the panchromatic display and being able to be used in 2D display mode. Moreover, since the number of pixel units is larger than that of FIG. 8A, the resolution is relatively high. In addition, the pixel units can also be controlled for time-sharing display, so that the pixel units such as P52 divided from the pixel structure (that is, the sub-pixels G included in the pixel units are located on the left columns of the columns of pixel group, or the sub-pixels G included in the pixel units are located on the same column) are able to be used for left eye display, and the pixel units such as P51 and P53 divided from the pixel structure (that is, the sub-pixels G included in the pixel units are located on the right columns of the columns of pixel groups) are able to be used for right eye display, thereby enabling the pixel structure to be applied to the VR and 3D display technologies.

Figure 8G:
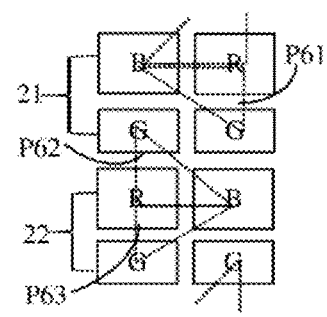

Referring to FIG. 8G, in an embodiment of the present disclosure, a certain pixel group is used together with adjacent pixel groups (not shown) below and over the certain pixel group to divide the pixel unit. Specifically, B and R of the first row in a pixel group (i.e., a pixel group row of the first pixel sub-group 21 of the pixel group) are shared by G (not shown) in the right column of the fourth row in adjacent pixel group (not shown) over the pixel group and G in the right column of the second row of the pixel group (i.e., another pixel group row of the first pixel sub-group 21 of the pixel group), to form two pixel units, one of which is labeled as P61 in the pixel unit of the pixel group. G in the left column of the second row in the pixel group (i.e., another pixel group row of the first pixel sub-group 21 of the pixel group) and G in the left column of the fourth row in the pixel group share R and B of the third row (i.e., the pixel group row of the second pixel sub-group 22 of the pixel group) to form two pixel units P62 and P63, that is, one first sub-pixel and one second sub-pixel adjacent in the second direction (row direction) are shared by two third sub-pixels adjacent to (with the upper and lower sides adjacent to the first sub-pixel) the first sub-pixel in the first direction (column direction). G in the right column of the fourth row in the pixel group (i.e., another pixel group row of the second pixel sub-group 22 of the pixel group) and G (not shown) in the right column of the second row in adjacent pixel group (not shown) below the pixel group share B (not shown) and R (not shown) in the first row of adjacent pixel group (not shown) below the pixel group, to form two pixel units (not shown). Therefore, each of the formed pixel units includes one R, one B, and one G, enabling the achievement of the panchromatic display and being able to be used in 2D display mode. Moreover, since the number of pixel units is larger than that of FIG. 8A, the resolution is relatively high. In addition, the pixel units can also be controlled for time-sharing display, so that the pixel units such as P62 and P63 divided from the pixel structure (that is, the third sub-pixels 203 included in the pixel units are located on the left columns of the columns of pixel groups, or the third sub-pixels 203 included in the pixel units are located on the same column) are able to be used for left eye display, and the pixel units such as P61 divided from the pixel structure (that is, the third sub-pixels 203 included in the pixel units are located on the right columns of the columns of pixel groups) are able to be used for right eye display, thereby enabling the pixel structure to be applied to the VR and 3D display technologies.

Figure 8H:
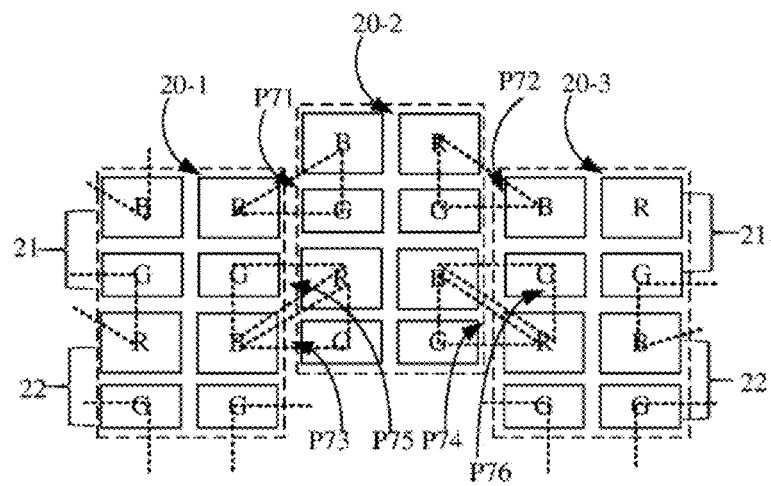

Referring to FIG. 8H, in an embodiment of the present disclosure, a certain pixel group is used for the division of pixel units together with adjacent pixel groups at the left and right sides of the certain pixel group (that is, adjacent in the second direction). Specifically, G in the left column of the fourth row of a pixel group 20-2 (i.e., another pixel group row of the second pixel sub-group 22 of the pixel group 20-2) and G in the right column of the second row of adjacent pixel group 20-1 at the left side of the pixel group 20-2 (i.e., the pixel group row of the first pixel sub-group 21 of the pixel group 20-1) share R of the third row of the pixel group 20-2 (i.e., the pixel group row of the second pixel sub-group 22 of the pixel group 20-2) and B of the third row of the pixel group 20-1 (i.e., the pixel group row of the second pixel sub-group 22 of the pixel group 20-1), to form pixel units P73 and P75, that is, one first sub-pixel and one second sub-pixel arranged diagonally are shared by two diagonally arranged third sub-pixels to form two pixel units. G in the right column of the fourth row of the pixel group 20-2 (i.e., another pixel group row of the second pixel sub-group 22 of the pixel group 20-2) and G of the left column of the second row of adjacent pixel group 20-3 at the right side of the pixel group 20-2 (i.e., another pixel group row of the first pixel sub-group 21 of the pixel group 20-3) share B of the third row of the pixel group 20-2 (i.e., the pixel group row of the second pixel sub-group 22 of the pixel group 20-2) and R of the third row of the pixel group 20-3 (i.e., the pixel group row of the second pixel sub-group 22 of the pixel group 20-3) to form pixel units P74 and P76, that is, one first sub-pixel and one second sub-pixel arranged diagonally are shared by two diagonally arranged third sub-pixels to form two pixel units. G in the left column of the second row of the pixel group 20-2 (i.e., another pixel group row of the first pixel sub-group 21 of the pixel group 20-2) and G (not shown) of the right column of the fourth row of adjacent pixel group (not shown) at the left side of the pixel group 20-2 share B of the first row of the pixel group 20-2 (i.e., the pixel group row of the first pixel sub-group 21 of the pixel group 20-2) and R of the first row of the pixel group 20-1 (i.e., a pixel group row of the first pixel sub-group 21 of the pixel group 20-1) to form the pixel unit P71 and another pixel unit (not shown). G in the right column of the second row of the pixel group 20-2 (i.e., another pixel group row of the first pixel sub-group 21 of the pixel group 20-2) and G in the left column of the fourth row of adjacent pixel group (not shown) at the right side of the pixel group 20-2 share R of the first row of the pixel group 20-2 (i.e., the pixel group row of the first pixel sub-group 21 of the pixel group 20-2) and B of the first row of the pixel group 20-3 (i.e., the pixel group row of the first pixel sub-group 21 of the pixel group 20-3) to form a pixel unit P72 and another pixel unit (not shown). Each of the pixel units includes one R, one B, and one G, enabling the achievement of the panchromatic display and being able to be used in 2D display mode. Moreover, since the number of pixel units is larger than that of FIG. 8A, the resolution is relatively high. In addition, two columns of pixel units in each column of pixel groups can also be controlled for time-sharing display, so that the pixel units such as P71, P73, and P76 divided from the pixel structure (that is, the third sub-pixels 203 included in the pixel units are located on the left columns of the columns of pixel groups, or the third sub-pixels 203 included in the pixel units are located on the same column) are able to be used for left eye display, and the pixel units such as P72, P74, and P75 divided from the pixel structure (that is, the third sub-pixels 203 included in the pixel units are located on the right columns of the columns of pixel groups) are able to be used for right eye display, thereby enabling the pixel structure to be applied to the VR and 3D display technologies.

Figure 8I:
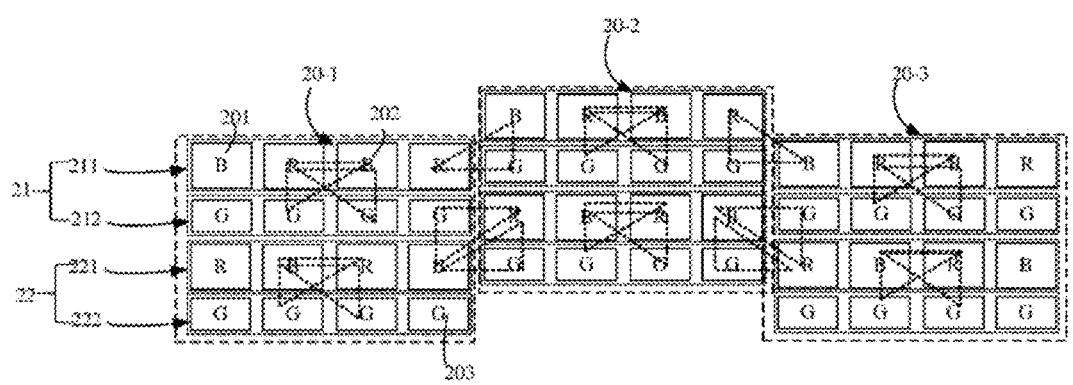
Figure 8J:
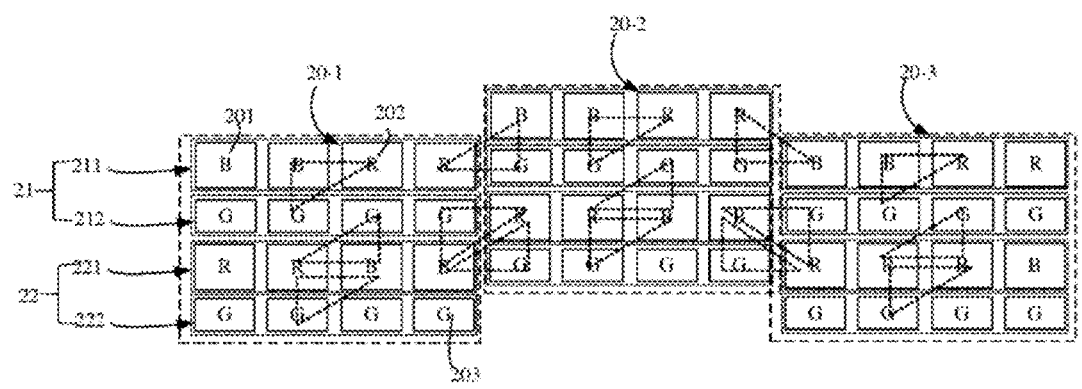

In the case where there are two first sub-pixels and two second sub-pixels in the pixel structure and the pixel arrangement of each pixel group is similar to the pixel arrangement of each pixel group shown in FIG. 6E and FIG. 6F, the division of the pixel units in the pixel structure may refer to FIG. 8A to FIG. 8C, in which each pixel unit may include at least one first sub-pixel, at least one second sub-pixel, and at least two third sub-pixels, where no sub-pixel is shared; the division of the pixel units in the pixel structure may also refer to FIG. 8D to FIG. 8H, in which one first sub-pixel and one second sub-pixel adjacent in the second direction are shared by two third sub-pixels adjacent to the first sub-pixel and/or the second sub-pixel in the first direction to form two pixel units, or one first sub-pixel and one second sub-pixel arranged diagonally are shared by two diagonally arranged third sub-pixels to form two pixel units. For example, the division manner of pixel units in a pixel structure formed by a plurality of pixel groups shown in FIG. 6E is as shown in FIG. 8I, and a certain pixel group is used for the division of the pixel units together with adjacent pixel groups at the left and right side of the certain pixel group (that is, adjacent in the second direction). Specifically, sub-pixels (BGRG) of the leftmost column of the pixel group 20-2 and sub-pixels (RGBG) of the rightmost column of the pixel group 20-1 adjacent to the left side of the pixel group 20-2 form corresponding pixel units according to the formation mode of P71, P73, and P75 in FIG. 4H (the RB arranged diagonally are shared by two diagonally arranged G). Sub-pixels (RGBG) of the rightmost column of the pixel group 20-2 and sub-pixels (BGRG) of the leftmost column of the pixel group 20-3 adjacent to the right side of the pixel group 20-2 form corresponding pixel units according to the formation mode of P72, P74, and P75 in FIG. 8H (the RB arranged diagonally are shared by two diagonally arranged G). Sub-pixels of the middle two columns in the pixel group 20-2 are divided into corresponding pixel units according to the division manner of the pixel units in any one of FIG. 8D to FIG. 8F. FIG. 8I shows the division of pixel units for sub-pixels of the middle two columns of the pixel group 20-2 according to the manner shown in FIG. 8D. For another example, the division manner of pixel units in a pixel structure formed by a plurality of pixel groups shown in FIG. 6F is as shown in FIG. 8J, and a certain pixel group is used together with adjacent pixel groups at the left and right side of the certain pixel group (that is, adjacent in the second direction) to divide the pixel units. Specifically, sub-pixels (BGRG) of the leftmost column of the pixel group 20-2 and sub-pixels (RGBG) of the rightmost column of the pixel group 20-1 adjacent to the left side of the pixel group 20-2 form corresponding pixel units according to the formation mode of P71, P73, and P75 in FIG. 8H (the RB arranged diagonally are shared by two diagonally arranged G). Sub-pixels (RGBG) of the rightmost column of the pixel group 20-2 and sub-pixels (BGRG) of the leftmost column of the pixel group 20-3 adjacent to the right side of the pixel group 20-2 form corresponding pixel units according to the formation mode of P72, P74, and P75 in FIG. 8H (the RB arranged diagonally are shared by two diagonally arranged G). Sub-pixels of the middle two columns in the pixel group 20-2 are divided into corresponding pixel units according to the division manner of the pixel units in any one of FIG. 8D to FIG. 8F. FIG. 8J shows the division of pixel units for sub-pixels of the middle two columns of the pixel group 20-2 according to the manner shown in FIG. 8E.

The display of each pixel unit is a result of mixing the content (color, brightness, etc.) displayed by driving each sub-pixel. Therefore, the display of each pixel unit is not only related to the type and number of sub-pixels constituting the pixel unit, but also related to the combination form of the sub-pixels constituting the pixel unit, and the driving signals required by the sub-pixels of different combination forms forming the pixel unit are also different. That is, after the pixel structure is divided into a plurality of pixel units, driving signals are provided for each of the sub-pixels according to the color required by each sub-pixel, so as to allocate the driving signals to the corresponding pixel units. The pixel sharing manner is able to achieve the best color mixing effect, thereby achieving an optimal display effect as well as an improved resolution. The above are only some specific sharing manners of sub-pixel, and it is also feasible to adopt other sharing manners.

The present disclosure also provides a display device, comprising the above pixel structure. The OLED display device may be any product or component having a display function such as an OLED panel, a mobile phone, a tablet computer, a television, a display, a notebook computer, a digital photo frame, and a navigator. Since the OLED display device of the present disclosure includes the foregoing pixel structure, the display device has a high display uniformity and good display quality.

The above embodiments are merely exemplary embodiments adopted to explain the principles of the present disclosure, but the present disclosure is not limited thereto. Various modifications and improvements can be made by persons of ordinary skills in the art without departing from the spirit and substance of the present disclosure, and such modifications and improvements are also considered as the protection scope of the present disclosure.

What is claimed is:

1. A pixel structure, comprising
a plurality of pixel groups arranged in an array, wherein each of the pixel groups comprises a first pixel sub-group and a second pixel sub-group disposed adjacent to each other in a first direction, each of the first pixel sub-group and the second pixel sub-group comprises sub-pixels of three different colors, and each of the first pixel sub-group and the second pixel sub-group comprises at least two sub-pixels having a same color and arranged consecutively,
wherein the first pixel sub-group and the second pixel sub-group in each of the pixel groups are offset from each other, each of the first pixel sub-group and the second pixel sub-group comprises sub-pixel groups of three different colors, an order of the sub-pixel groups of three different colors in the first pixel sub-group is different from an order of the sub-pixel groups of three different colors in the second pixel sub-group, and each sub-pixel group comprises at least two sub-pixels having a same color and consecutively arranged in the first direction.

2. The pixel structure according to claim 1, wherein the sub-pixels of three different color comprise at least one first sub-pixel, at least one second sub-pixel, and third sub-pixels; in each pixel sub-group, a number of the first sub-pixels is equal to a number of the second sub-pixels, and a number of the third sub-pixels is a sum of the number of the first sub-pixels and the number of the second sub-pixels; the first sub-pixels and the second sub-pixels are arranged in a second direction to form a pixel group row, and the third sub-pixels are consecutively arranged in the second direction and form another pixel group row disposed adjacent to the pixel group row in the first direction, the another pixel group row in the first pixel sub-group and the another pixel group row in the second pixel sub-group are separated by the pixel group row in the first pixel sub-group, and two adjacent pixel groups in the second direction are offset from each other.

3. The pixel structure according to claim 2, wherein in the first pixel sub-group and the second pixel sub-group of each pixel group, an order of the first sub-pixels is the same as an order of the second sub-pixels; or in the first pixel sub-group and the second pixel sub-group of each pixel group, an order of the first sub-pixels is different from an order of the second sub-pixels.

4. The pixel structure according to claim 3, wherein in each pixel sub-group, the number of the first sub-pixels and the second sub-pixels is one or more; and when a plurality of the first sub-pixels and the second sub-pixels are comprised in each pixel sub-group, the first sub-pixels and the second sub-pixels are alternately arranged in the second direction, or two or more of the first sub-pixels are arranged to form a first sub-pixel group, the second sub-pixels equaling to the sub-pixels in the first sub-pixel group in number are arranged to form a second sub-pixel group, and the first sub-pixel group and the second sub-pixel group are consecutively arranged in the second direction.

5. The pixel structure according to claim 2, wherein in the adjacent two pixel groups in the second direction and offset from each other, a region defined by each of the another pixel group rows in one of the two pixel groups at least partially coincides with a region defined by a corresponding pixel group row in the other one of the two pixel group.

6. The pixel structure according to claim 2, wherein each of the pixel groups is divided into at least one pixel unit, each pixel unit comprising sub-pixels of three colors; and during division of the pixel unit, no sub-pixel in each of the pixel groups is shared, or at least one sub-pixel in each of the pixel groups is shared.

7. The pixel structure according to claim 6, wherein one first sub-pixel and one second sub-pixel adjacent to each other in the second direction are shared by two third sub-pixels adjacent to the first sub-pixel and/or the second sub-pixel in the first direction to form two pixel units, or one first sub-pixel and one second sub-pixel arranged diagonally are shared by two diagonally arranged third sub-pixels to form two pixel units, and each of the pixel units comprises one first sub-pixel, one second sub-pixel, and one third sub-pixel.

8. The pixel structure according to claim 6, wherein in all pixel units divided from all pixel groups, some of the pixel units are used for realizing left eye display, and some of the pixel units are used for realizing right eye display.

9. The pixel structure according to claim 1, wherein the first pixel sub-group and the second pixel sub-group in each of the pixel groups are disposed adjacent to each other in the first direction, the sub-pixel groups of three different colors in each of the first pixel sub-group and the second pixel sub-group are consecutively arranged in the second direction, and an arrangement position of the sub-pixel group of at least one color in the first pixel sub-group is different from an arrangement position of the sub-pixel group of at least one color in the second sub-group.

10. The pixel structure according to claim 9, wherein the sub-pixel groups of three different colors comprise a first sub-pixel group, a second sub-pixel group, and a third sub-pixel group; in a same pixel group, a center line of the third sub-pixel group of the second pixel sub-group in the second direction is located in a gap between the first sub-pixel group and the second sub-pixel group in the first pixel sub-group, or a center line of the first sub-pixel group of the first pixel sub-group in the second direction is located in a gap between the second sub-pixel group and the third sub-pixel group in the second pixel sub-group.

11. The pixel structure according to claim 1, wherein each of the pixel groups is divided into at least one pixel unit, each pixel unit comprises sub-pixels of three colors; and during division of the pixel unit, no sub-pixel in each of the pixel groups is shared, or at least one sub-pixel in each of the pixel groups is shared.

12. The pixel structure according to claim 11, wherein during division of the pixel unit, each sub-pixel in the first sub-pixel sub-group and the second sub-pixel sub-group in each of the pixel groups is shared.

13. The pixel structure according to claim 11, wherein in all pixel units divided from all pixel groups, some of the pixel units are used for realizing left eye display, and some of the pixel units are used for realizing right eye display.

14. A mask for manufacturing the pixel structure according to claim 1, comprising a plurality of evaporation openings.

15. The mask according to claim 14, wherein a size of each of the plurality of evaporation opening of the mask corresponds to a sum of sizes of at least two sub-pixels of a same color in the pixel structure.

* * * * *